(12) United States Patent
Kang et al.

(10) Patent No.: US 8,243,487 B2
(45) Date of Patent: Aug. 14, 2012

(54) STACKED MEMORY MODULE AND SYSTEM

(75) Inventors: Uk-Song Kang, Seongnam-si (KR); Hoe-Ju Chung, Yongin-si (KR); Jang-Seok Choi, Seoul (KR); Hoon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/218,646

(22) Filed: Aug. 26, 2011

(65) Prior Publication Data

US 2011/0310649 A1    Dec. 22, 2011

Related U.S. Application Data

(62) Division of application No. 12/454,064, filed on May 12, 2009, now Pat. No. 8,031,505.

(30) Foreign Application Priority Data

Jul. 25, 2008  (KR) .................. 10-2008-0072904
Dec. 10, 2008  (KR) .................. 10-2008-0125338

(51) Int. Cl.
*G11C 5/02* (2006.01)
(52) U.S. Cl. ............................................. 365/51; 365/52
(58) Field of Classification Search .................. 365/51, 365/52
See application file for complete search history.

(56) References Cited

U.S. PATENT DOCUMENTS

2007/0132085 A1* 6/2007 Shibata et al. ................ 257/686
* cited by examiner

*Primary Examiner* — Huan Hoang
(74) *Attorney, Agent, or Firm* — Monica H. Choi

(57) ABSTRACT

A three dimensional memory module and system are formed with at least one slave chip stacked over a master chip. Through semiconductor vias (TSVs) are formed through at least one of the master and slave chips. The master chip includes a memory core for increased capacity of the memory module/system. In addition, capacity organizations of the three dimensional memory module/system resulting in efficient wiring is disclosed for forming multiple memory banks, multiple bank groups, and/or multiple ranks of the three dimensional memory module/system.

9 Claims, 32 Drawing Sheets

| External Data Bus | # of Rank(s) in 3D IC Package | # of Bank Group(s) in 3D IC Package | Internal Data Bus Type In Master Area | Internal Data Bus Type In Slave Area |
|---|---|---|---|---|
| Bidirectional External Read/Write Data Bus | Mono | Mono (FIG. 24) | Bidirectional Bus | Bidirectional Bus ← 471 |
| | | Multiple (FIG. 28) | Bidirectional Bus (Separate bus for each bank group.) | Bidirectional Bus ← 472 |
| | Multiple | Mono (FIG. 29) | Unidirectional Buses | Bidirectional Bus ← 473 |
| | | Multiple (FIG. 33) | Unidirectional Buses (Separate bus for each bank group.) | Bidirectional Bus ← 474 |
| Unidirectional External Read and Write Data Buses | Mono | Mono (FIG. 34) | Unidirectional Buses | Bidirectional Bus ← 475 |
| | | Multiple (FIG. 35) | Unidirectional Buses (Separate bus for each bank group.) | Bidirectional Bus ← 476 |
| | Multiple | Mono (FIG. 29) | Unidirectional Buses | Bidirectional Bus ← 477 |
| | | Multiple (FIG. 33) | Unidirectional Buses (Separate bus for each bank group.) | Bidirectional Bus ← 478 |

*FIG. 23*

STACKED MEMORY MODULE AND SYSTEM

CROSS-REFERENCE TO RELATED APPLICATION(S)

The present application is a divisional of an earlier filed patent application with Ser. No. 12/454,064 filed on May 12, 2009 now U.S. Pat. No. 8,031,505, for which priority is claimed. This earlier filed copending patent application with Ser. No. 12/454,064 is in its entirety incorporated herewith by reference.

The present application also claims priority under 35 USC §119 to Korean Patent Application No. 2008-0072904 filed on Jul. 25, 2008 and to Korean Patent Application No. 2008-0125338 filed on Dec. 10, 2008, in the Korean Intellectual Property Office, the disclosures of which is incorporated herein in its entirety by reference. Certified copies of Korean Patent Application No. 2008-0072904 and Korean Patent Application No. 2008-0125338 are contained in the parent copending patent application with Ser. No. 12/454,064.

TECHNICAL FIELD

The present invention relates generally to memory systems, and more particularly, to a three dimensional stacked memory system with high memory capacity and having efficient wiring and capacity organization for multiple memory banks, bank groups and/or ranks formed in the memory system.

BACKGROUND OF THE INVENTION

The area occupied by an integrated circuit device is desired to be minimized for being used in smaller portable electronic devices. Accordingly, a three dimensional stacked memory device is formed in the prior art for minimizing the area occupied by the memory device.

For example, U.S. Pat. No. 6,133,640 to Leedy discloses a memory device with multiple memory cell arrays stacked on top of a memory controller. However, Leedy just discloses one three dimensional memory device and not a three dimensional memory module/system.

U.S. Pat. No. 6,768,163 to Tanaka et al. discloses a first semiconductor substrate with a memory cell array stacked on a second semiconductor substrate having a word line control circuit to control the word lines of the memory cell array. Tanaka also discloses one three dimensional memory device and not a three dimensional memory module/system.

In addition, Tanaka discloses the integrated circuit package with the stacked semiconductor substrates having vertical terminals disposed on the outside periphery of the substrates. Such vertical terminals disposed on the outside periphery of the substrates disadvantageously increase the area occupied the three dimensional memory device of Tanaka.

U.S. Pat. No. 7,123,497 to Matsui et al. discloses multiple DRAM (dynamic random access memory) chips stacked on top of an IO (input output) chip. TSVs (through semiconductor vias) are formed through such chips for interconnection among such chips. TSVs are vertical electrical connections formed to pass completely though the semiconductor substrate of the stacked chips. However, Matsui is directed to using the IO chip only for conversion of data width and transfer rate during transfer of data to/from the DRAM chips.

SUMMARY OF THE INVENTION

In a general aspect of the present invention, a three dimensional memory module/system is formed with a stack of slave and master chips with high memory capacity and efficient wiring and capacity organization for multiple memory banks, bank groups and/or ranks formed in the memory module/system.

In an aspect of the present invention, a three dimensional memory system includes a master chip, at least one slave chip, and through electrodes. The master chip has a master memory core formed therein. The at least one slave chip is stacked with the master chip, and each slave chip has a respective slave memory core. The through electrodes are formed through the at least one slave chip.

In an embodiment of the present invention, the slave and master memory cores form a total memory capacity of the three dimensional memory system.

In another embodiment of the present invention, the slave and master memory cores form at least one memory bank, bank group, or rank of the three dimensional memory system.

In a further embodiment of the present invention, the through electrodes are formed onto the master chip and not through the master chip when the master chip is formed faced up over a substrate.

In another embodiment of the present invention, the master chip is formed faced down over a substrate. In that case, the through electrodes are formed through the master chip.

In a further embodiment of the present invention, the through electrodes are aligned along at least one row formed across a center area of the master chip with interconnections extending from the through electrodes to at least one memory bank of the master memory core. In that case, the three dimensional memory system further includes an I/O circuit disposed on the master chip between rows of the through electrodes. Alternatively, the three dimensional memory system includes at least one row of I/O pads formed on the master chip to be parallel to the row of through electrodes, and the I/O pads are coupled to an I/O circuit of the master chip.

In another embodiment of the present invention, the three dimensional memory system includes a respective test circuit disposed on each of the master and slave chips between rows of the through electrodes.

In a further embodiment of the present invention, the three dimensional memory system includes a substrate having external terminals for providing external signals to the master chip that is formed faced down over the substrate.

In another embodiment of the present invention, the three dimensional memory system includes first, second, and third interfaces. The first interface is formed between a first I/O unit in the master chip and an external device. The second interface is formed between the first I/O unit and a respective second I/O unit in each of the master and slave chips. The third interface is formed between each of the second I/O units and a respective one of the slave and master memory cores.

In an example embodiment of the present invention, the three dimensional memory system includes a respective state circuit for indicating a respective command execution state for each of the slave and master memory cores, with each state circuit being disposed in a respective one of the slave and master chips. In that case, the three dimensional memory system also includes a tracking circuit disposed in the master chip for controlling the first I/O unit depending on the respective command execution states of the slave and master memory cores as indicated by the respective state circuits.

In another embodiment of the present invention, the three dimensional memory system includes a master state circuit and a tracking circuit. The master state circuit is disposed in the master chip for indicating a respective command execution state for each of the slave and master memory cores. The tracking circuit is disposed in the master chip for controlling the first I/O unit depending on the respective command execution states of the slave and master memory cores as indicated by the master state circuit.

In a further embodiment of the present invention, the three dimensional memory system includes a plurality of slave chips stacked over the master chip, with each slave chip having a respective slave memory core. At least one memory bank, bank group, or rank of the three dimensional memory system is formed with a respective portion of each of the stacked slave chips. For example, at least one memory bank, bank group, or rank of the three dimensional memory system is formed with a respective portion of each of the stacked slave and master chips.

In another aspect of the present invention, a three dimensional memory system includes a plurality of stacked integrated circuit chips and a plurality of bank groups or a plurality of ranks formed with at least one of the stacked integrated circuit chips. For example, the stacked integrated circuit chips include a master chip and at least one slave chip stacked with the master chip.

In an example embodiment of the present invention, the three dimensional memory system includes a respective separate data bus formed for each bank group as part of a master internal data bus.

In a further embodiment of the present invention, the three dimensional memory system includes a respective set of unidirectional read and write data buses formed for each rank as part of a master internal data bus.

In another embodiment of the present invention, the three dimensional memory system includes first and second bank groups. The first bank group is comprised of a first set of memory banks extending vertically through the stack integrated circuits. The second bank group is comprised of a second set of memory banks extending vertically through the stack integrated circuits.

In that case, the three dimensional memory system further includes first and second through electrodes. The first through electrode extends through at least a portion of the stack integrated circuits for coupling among the first set of memory banks. The second through electrode extends through at least a portion of the stack integrated circuits for coupling among the second set of memory banks.

In another aspect of the present invention, a three dimensional memory system includes a master chip, at least one slave chip stacked with the master chip, through electrodes formed through the at least one slave chip, an external data bus that is bidirectional or unidirectional, and a master internal data bus. The master internal data bus is bidirectional when one rank is formed in the stacked chips, or alternatively includes unidirectional read and write buses when a plurality of ranks are formed in the stacked chips, when the external data bus is bidirectional.

In an embodiment of the present invention, the master internal data bus includes unidirectional read and write buses for any number of ranks formed in the stacked chips when the external data bus is unidirectional.

In another embodiment of the present invention, the master internal data bus includes a respective separate data bus formed for each bank group when a plurality of bank groups are formed in the stacked chips.

In a further embodiment of the present invention, the three dimensional memory system includes a slave internal data bus that is bidirectional when the external data bus is either bidirectional or unidirectional.

In another embodiment of the present invention, the three dimensional memory system includes a slave internal data bus that is bidirectional when one rank or a plurality of ranks are formed in the stacked chips.

In an alternative embodiment of the present invention, the three dimensional memory system includes a slave internal data bus that is bidirectional when one bank group or a plurality of bank groups are formed in the stacked chips.

In another aspect of the present invention, a three dimensional memory system includes a first type chip, a plurality of second type chips stacked with the first type chip, and through electrodes formed through at least one of the second type chips. The three dimensional memory system further includes a first signal path disposed on the first type chip and a respective second signal path disposed on each second type chip. In that case, the first signal path is coupled to the respective second signal paths via the through electrodes. In addition, a first length of the first signal path is maximized and a second length of each respective second signal path is minimized.

In an embodiment of the present invention, the first type chip is a master chip, and the plurality of the second type chips are a plurality of slave chips stacked with the master chip.

In that case, the first signal path is for transmitting a first signal from an external source through the master chip, and the second signal path is for transmitting a second signal from one of the through electrodes to the slave chip.

In an example embodiment of the present invention, the first length of the first signal path is greater than the second length of the second signal path.

In another aspect of the present invention, a memory system includes a memory controller and a three dimensional memory module. The three dimensional memory module includes a master chip, at least one slave chip stacked with the master chip, and through electrodes. The master chip has a master memory core, and each slave chip has a respective slave memory core. The through electrodes are formed through the at least one slave chip. The memory controller and the master chip exchange at least one of command, address, and data signals. In an embodiment of the present invention, the slave and master memory cores form a total memory capacity of the three dimensional memory module.

In an example embodiment of the present invention, the slave and master memory cores form at least one memory bank, bank group, or rank of the three dimensional memory module. In that case, the memory controller transmits a respective bank group address to the master chip to access each bank group, and transmits a respective bank address to the master chip to access each memory bank.

In a further embodiment of the present invention, the memory controller activates a respective chip select signal sent to the master chip for accessing each rank when the memory controller and the master chip are coupled via a bidirectional data bus.

In another embodiment of the present invention, the memory controller transmits a respective rank identification unit within a frame sent to the master chip for accessing each rank when the memory controller and the master chip are coupled via a unidirectional data bus.

In a further embodiment of the present invention, the three dimensional memory module further includes first, second, and third interfaces. The first interface is coupled between a first I/O unit in the master chip and the memory controller. The second interface is coupled between the first I/O unit and a respective second I/O unit in each of the master and slave chips. The third interface is coupled between each of the second I/O units and a respective one of the slave and master memory cores.

In another embodiment of the present invention, the memory module includes a respective state circuit and a tracking circuit. The respective state circuit indicates a respective command execution state for each of the slave and master memory cores, and each state circuit is disposed in a respective one of the slave and master chips. The tracking circuit is disposed in the master chip for controlling the first I/O unit depending on the respective command execution states of the slave and master memory cores as indicated by the respective state circuits.

In a further embodiment of the present invention, the memory module includes a master state circuit and a tracking circuit. The master state circuit is disposed in the master chip for indicating a respective command execution state for each of the slave and master memory cores. The tracking circuit is disposed in the master chip for controlling the first I/O unit depending on the respective command execution states of the slave and master memory cores as indicated by the master state circuit.

In this manner, by forming a master memory core in the master chip for forming the total memory capacity of the memory module with the slave memory cores, the capacity of the memory module is increased. In addition, the memory capacity is organized to have multiple memory banks, bank groups and/or ranks for efficient wiring.

These and other features and advantages of the present invention will be better understood by considering the following detailed description of the invention which is presented with the attached drawings.

BRIEF DESCRIPTION OF THE DRAWINGS

FIG. 23 shows a table of unidirectional or bidirectional internal data buses to be formed in a master area and a slave area depending on type of external data bus, the number of ranks, and the number of bank groups in the three dimensional memory module of FIG. 1, according to an example embodiment of the present invention;

FIGS. 25 and 34 illustrate wirings formed through a master chip and a slave chip when one rank and one bank group are formed in the three dimensional memory module of FIG. 1 with unidirectional external data buses, according to an example embodiment of the present invention;

FIGS. 26 and 35 illustrate wirings formed through a master chip and a slave chip when one rank and multiple bank groups are formed in the three dimensional memory module of FIG. 1 with unidirectional external data buses, according to an example embodiment of the present invention;

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40 refer to elements having similar structure and/or function, unless stated other-wise.

DETAILED DESCRIPTION

Figure 1:
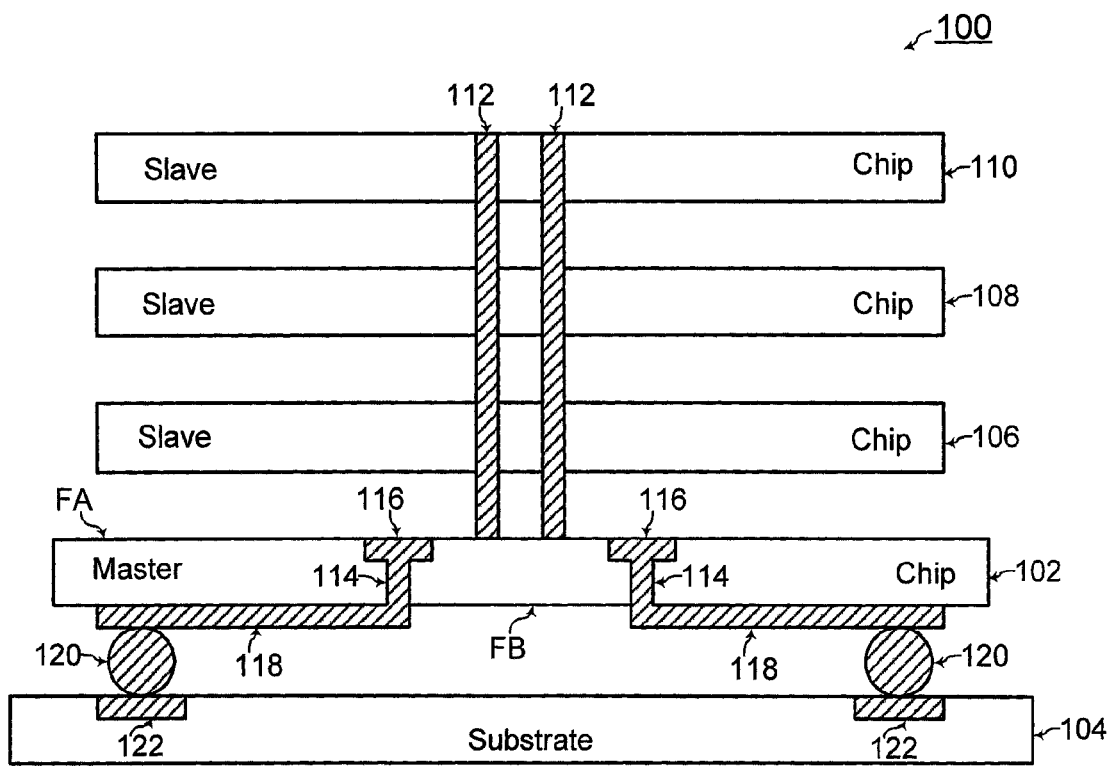
FIG. 1 shows a cross-sectional view of a three dimensional memory module, according to an example embodiment of the present invention.

FIG. 1 shows a cross-sectional view of a three dimensional memory module 100, according to an example embodiment of the present invention. A memory module is broadly defined as an integrated circuit package formed with multiple integrated circuit memory dies (i.e., integrated circuit memory chips) with controlled access to the multiple memory dies. Referring to FIG. 1, the three dimensional memory module 100 includes a master chip 102 mounted on a substrate 104. In addition, a plurality of slave chips 106, 108, and 110 are stacked over the master chip 102.

A first slave chip 106 is stacked over the master chip 102, a second slave chip 108 is stacked over the first slave chip 106, and a third slave chip 110 is stacked over the second slave chip 108. However, the present invention may be practiced with any number of slave chips stacked over any number of the master chip 102.

The three dimensional memory module 100 further includes first TSVs (through semiconductor vias, i.e., through electrodes) 112 formed through the slave chips 106, 108, and 110. Such TSVs are formed completely through respective semiconductor substrates of the slave chips 106, 108, and 110. In addition, second TSVs (through semiconductor vias) 114 are formed completely through a respective semiconductor substrate of the master chip 102.

Furthermore, first internal electrodes 116 are formed at a first face FA of the master chip 102, and second internal electrodes 118 are formed on a second face FB of the master chip 102. External terminals 120 connect the internal electrodes 118 of the master chip 102 to interconnects 122 of the substrate 104.

Such interconnect structures 112, 114, 116, 118, 120, and 122 provide electrical connection between the master chip 102, the slave chips 106, 108, and 110, and a memory controller 130 (shown in FIG. 2) outside of the three dimensional memory module 100. The master chip 102 controls read and write operations in respective memory cores of the master chip 102 and the slave chips 106, 108, and 110. The external terminals 120 provide external signals such as command, address, and data signals from the memory controller 130 outside of the memory module 100 to the master chip 102.

Figure 2:
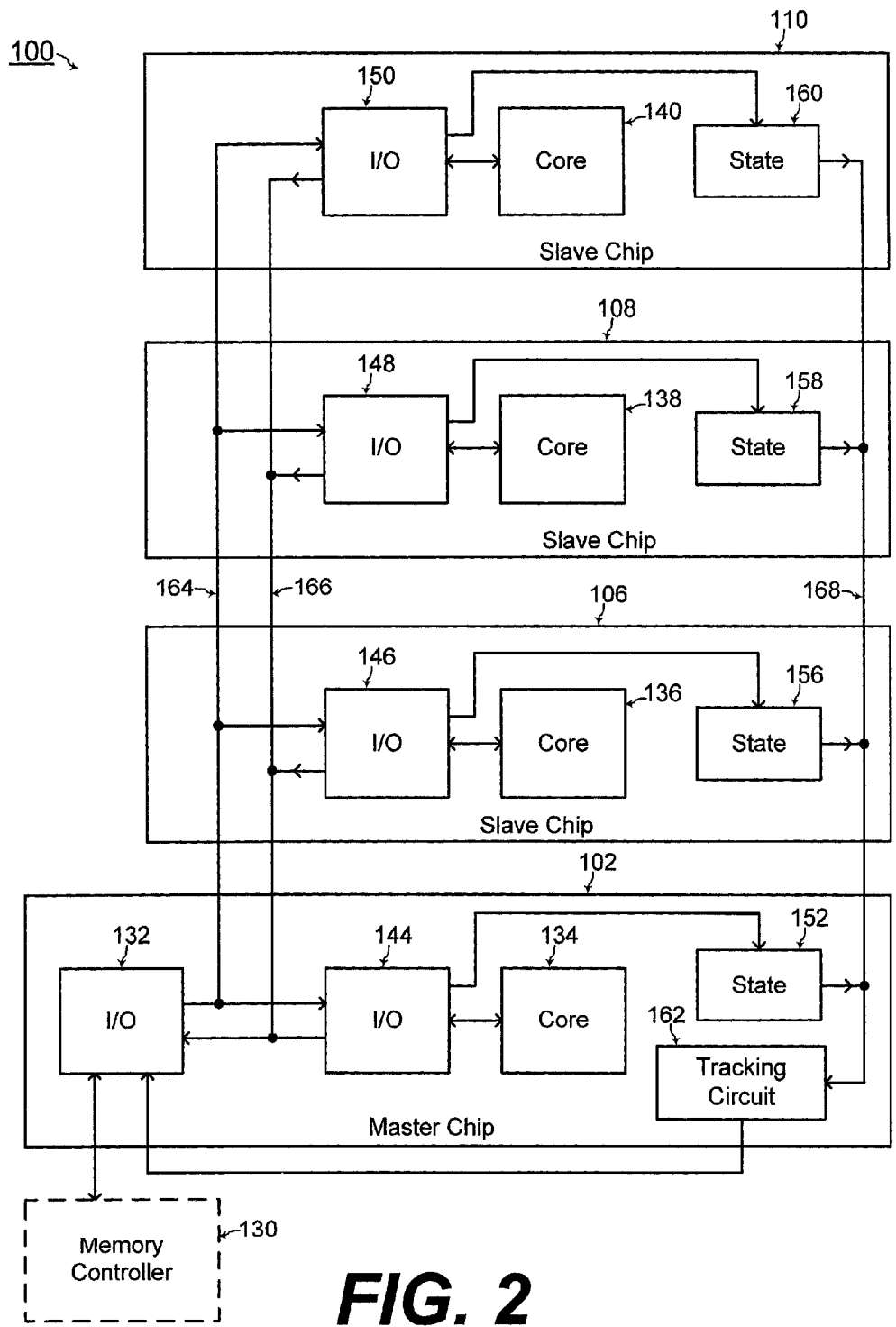
FIG. 2 shows a block diagram of a three dimensional memory system including the three dimensional memory module of FIG. 1, according to an example embodiment of the present invention.

FIG. 2 shows a block diagram of a three dimensional memory system including the memory controller 130 and the three dimensional memory module 100 of FIG. 1 with the master chip 102 and the slave chips 106, 108, and 110, according to an example embodiment of the present invention. The memory controller 130 (shown outlined in dashed lines in FIG. 2) is disposed outside of the three dimensional memory module 100. The master chip 102 includes an external I/O (input/output) 132 for forming a first interface between the memory controller 130 and each of the master chip 102 and the slave chips 106, 108, and 110.

The master chip 102 includes a master memory core 134, and the slave chips 106, 108, and 110 include respective slave memory cores 136, 138, and 140, respectively. In addition, a master I/O (input/output) 144 is coupled between the external I/O 132 and the master memory core 134. A first slave I/O (input/output) 146 is coupled between the external I/O 132 and the slave memory core 136 in the first slave chip 106. A second slave I/O (input/output) 148 is coupled between the external I/O 132 and the slave memory core 138 in the second slave chip 108. A third slave I/O (input/output) 150 is coupled between the external I/O 132 and the slave memory core 140 in the third slave chip 110.

A first interface is formed between the external I/O 132 and the memory controller 130 that is an example external device formed outside of the three dimensional memory module 100. A second interface is formed between the external I/O 132 and each of the master and slave I/Os 144, 146, 148, and 150. A third interface is formed between the master and slave I/Os 144, 146, 148, and 150 and the respective master and slave memory cores 134, 136, 138, and 140, respectively.

In addition, the master and slave chips 102, 106, 108, and 110 include respective state circuits 152, 156, 158, and 160, respectively. Furthermore, the master chip 102 includes a tracking circuit 162. The respective state circuits 152, 156, 158, and 160 indicate a respective command execution state for the master and slave cores 134, 136, 138, and 140, respectively. The respective command execution state indicates whether a respective command such as a read, write, active, or refresh command has been executed by the respective memory core.

A command from the memory controller 130 is received by the external I/O 132 that decodes such a command to control one of the master and slave I/Os 144, 146, 148, and 150 to execute the command in a respective one of the master and slave memory cores 134, 136, 138, and 140. The state of execution of such a command is indicated by a respective one of the state circuits 152, 156, 158, and 160 to the tracking circuit 162. The tracking circuit 162 is coupled to the external I/O 132 to control the external I/O 132 to process another command from the memory controller 130 depending on such a state of execution of the prior command.

Further in FIG. 2, a first interconnect structure 164 comprised of at least one TSV (through semiconductor via, i.e., through electrode) is formed through the semiconductor substrates of the master and slave chips 102, 106, 108, and 110 for the external I/O 132 sending signals to the master and slave I/Os 144, 146, 148, and 150. A second interconnect structure 166 comprised of at least one TSV (through semiconductor via, i.e., through electrode) is formed through the semiconductor substrates of the master and slave chips 102, 106, 108, and 110 for the master and slave I/Os 144, 146, 148, and 150 to send signals to the external I/O 132. A third interconnect structure 168 comprised of at least one TSV (through semiconductor via, i.e., through electrode) is formed through the semiconductor substrates of the master and slave chips 102, 106, 108, and 110 for the state circuits 152, 156, 158, and 160 indicating the respective command execution states to the tracking circuit 162.

Figure 3:
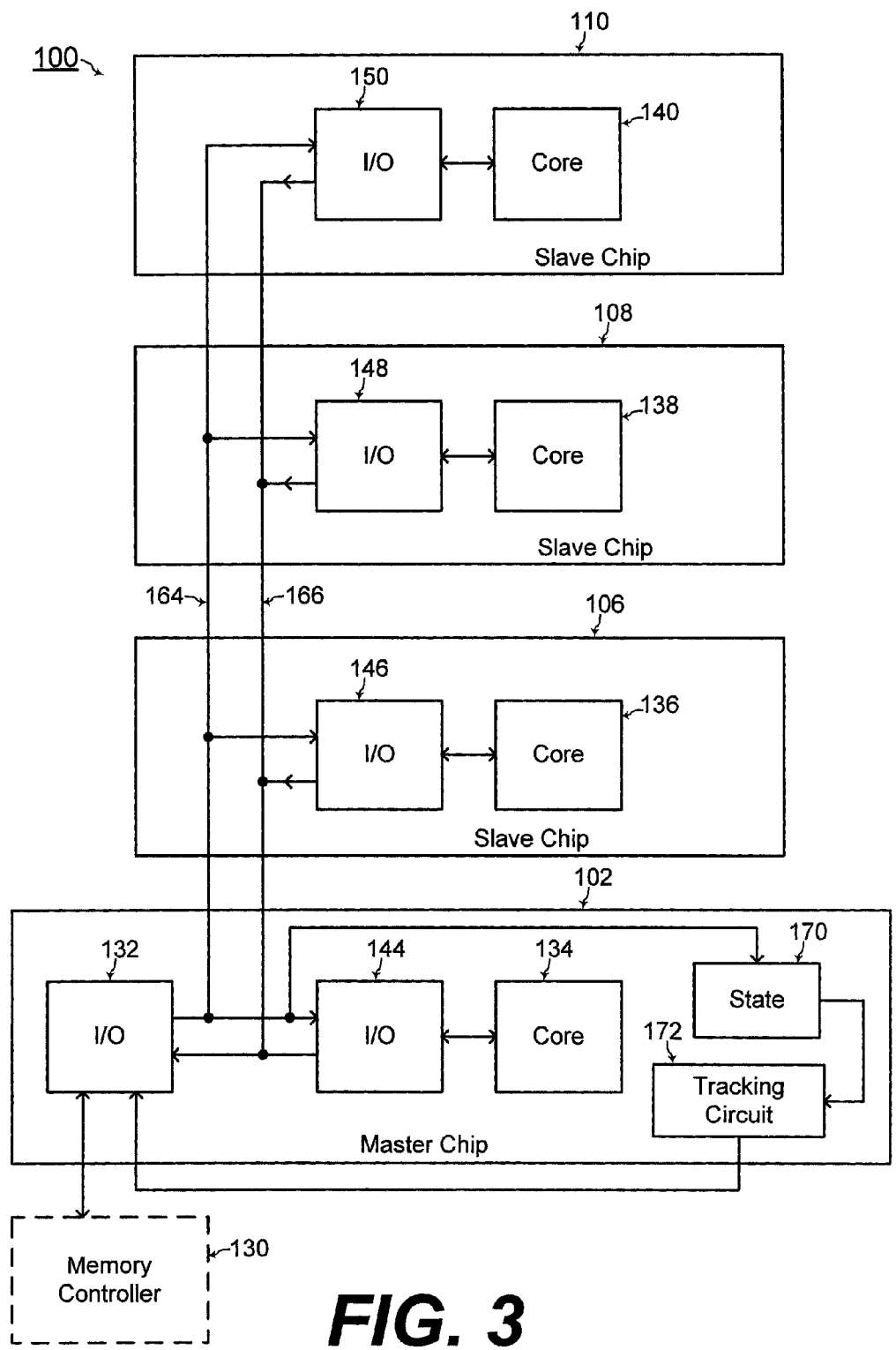
FIG. 3 shows a block diagram of a three dimensional memory system including the three dimensional memory module of FIG. 1, according to another embodiment of the present invention.

FIG. 3 shows a block diagram of a three dimensional memory system including the memory controller 130 and the three dimensional memory module 100 of FIG. 1, according to another embodiment of the present invention. The block diagram of FIG. 3 is similar to FIG. 2 except that the slave chips 106, 108, and 110 in FIG. 3 do not have the respective state circuits 156, 158 and 160 of FIG. 2. Instead, the master chip 102 includes a master state circuit 170 coupled to the external I/O 132 for indicating to a tracking circuit 172 the respective command execution state for each of the master and slave memory cores 134, 136, 138, and 140 from the commands generated from the external I/O 132.

A tracking circuit 172 is coupled to the external I/O 132 to control the external I/O 132 to process another command from the memory controller 130 depending on the state of execution of a prior command as indicated by the master state circuit 170. In the embodiment of FIG. 3, the third interconnect structure 168 of FIG. 2 is not present to minimize the number of TSVs (through semiconductor vias).

Figure 4:
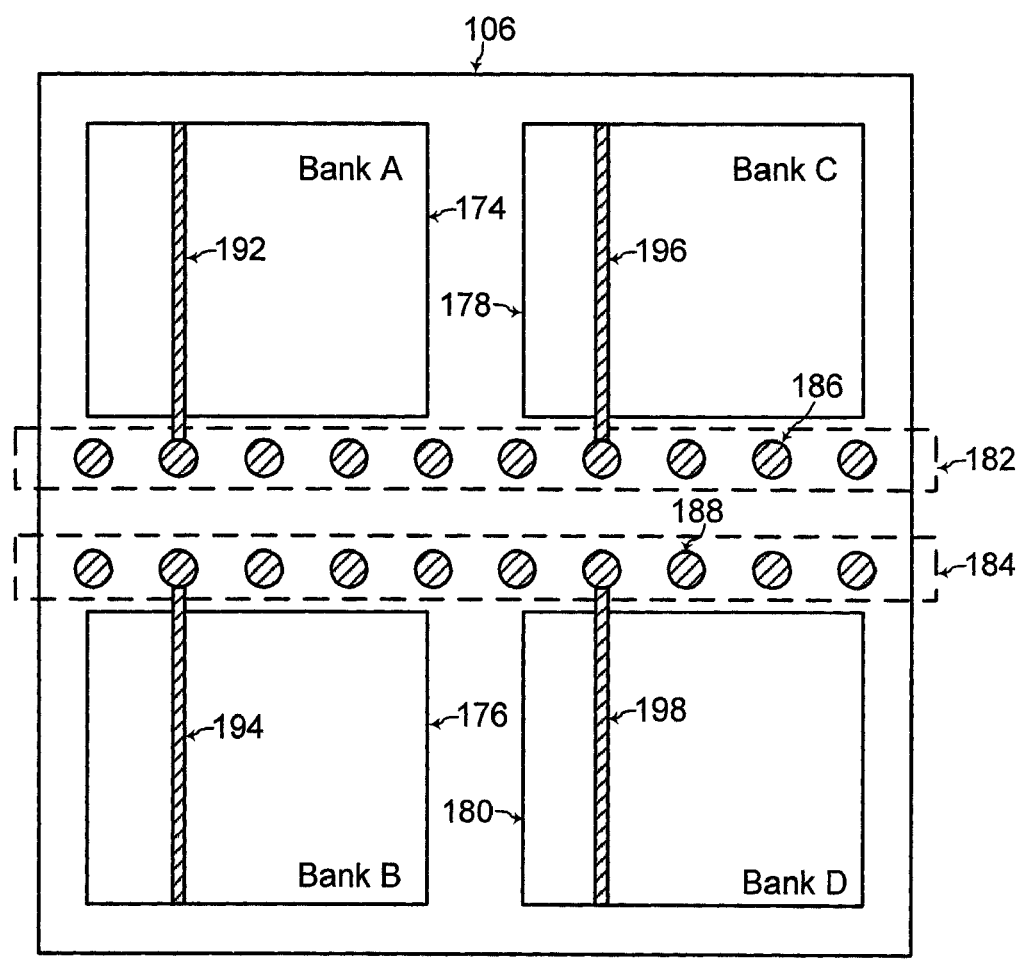
FIG. 4 shows a top view of a slave chip in the three dimensional memory module of FIG. 1, according to an example embodiment of the present invention.

FIG. 4 shows a top view of an example one 106 of the slave chips 106, 108, and 110 in the three dimensional memory module 100 of FIG. 1, according to an example embodiment of the present invention. The slave chip 106 includes a first memory bank 174, a second memory bank 176, a third memory bank 178, and a fourth memory bank 180 of memory cells forming the memory core 136 of the slave chip 106.

FIG. 4 also shows a first TSV (through semiconductor via) area 182 having a plurality of TSVs (through semiconductor vias) 186 formed in parallel through the respective semiconductor substrates of the slave chips 106, 108, and 110. In addition in FIG. 4, a second TSV (through semiconductor via) area 184 has a plurality of TSVs (through semiconductor vias) 188 formed in parallel through the respective semiconductor substrates of the slave chips 106, 108, and 110.

A first internal interconnect 192 is formed from a TSV (through semiconductor via) of the first TSV area 182 to at least one node of the first memory bank 174 that is disposed near the first TSV area 182. The term "internal interconnect" refers to the interconnect being formed during fabrication of the chip 106 that is subsequently stacked within the three dimensional memory module 100.

Similarly referring to 4, a second internal interconnect 194 is formed from a TSV (through semiconductor via) of the second TSV area 184 to at least one node of the second memory bank 176 that is disposed near the second TSV area 184. Also, a third internal interconnect 196 is formed from another TSV (through semiconductor via) of the first TSV area 182 to at least one node of the third memory bank 178 that is disposed near the first TSV area 182. Further, a fourth internal interconnect 198 is formed from another TSV (through semiconductor via) of the second TSV area 184 to at least one node of the fourth memory bank 180 that is disposed near the second TSV area 184.

Figure 5:
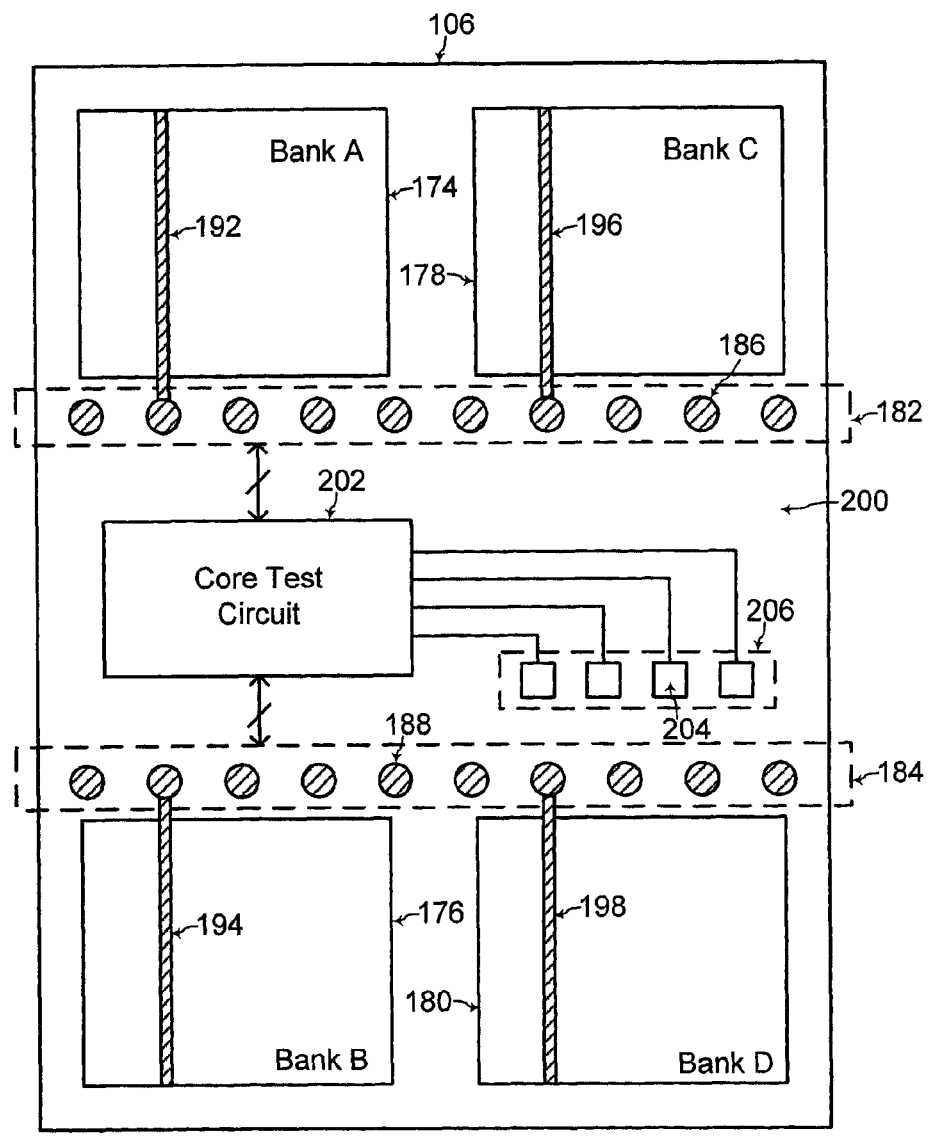
FIG. 5 shows a top view of a slave chip in the three dimensional memory module of FIG. 1, according to another example embodiment of the present invention.

FIG. 5 shows a top view of an example one 106 of the slave chips 106, 108, and 110 in the three dimensional memory module 100 of FIG. 1, according to another example embodiment of the present invention. FIG. 5 includes the similarly numbered elements of FIG. 4, but FIG. 5 further includes a center area 200 between the first and second TSV areas 182 and 184 having a core test circuit 202 for testing the memory banks 174, 176, 178, and 180. The core test circuit 202 is connected to test pads 204 in a test pad area 206 and to the TSVs 186 and 188 for being coupled to the memory banks 174, 176, 178, and 180. External test signals from a test system may be applied on the test pads 204. A respective test circuit 202 may be formed in a respective center area 200 of each of the master and slave chips 102, 106, 108, and 110.

Figure 6:
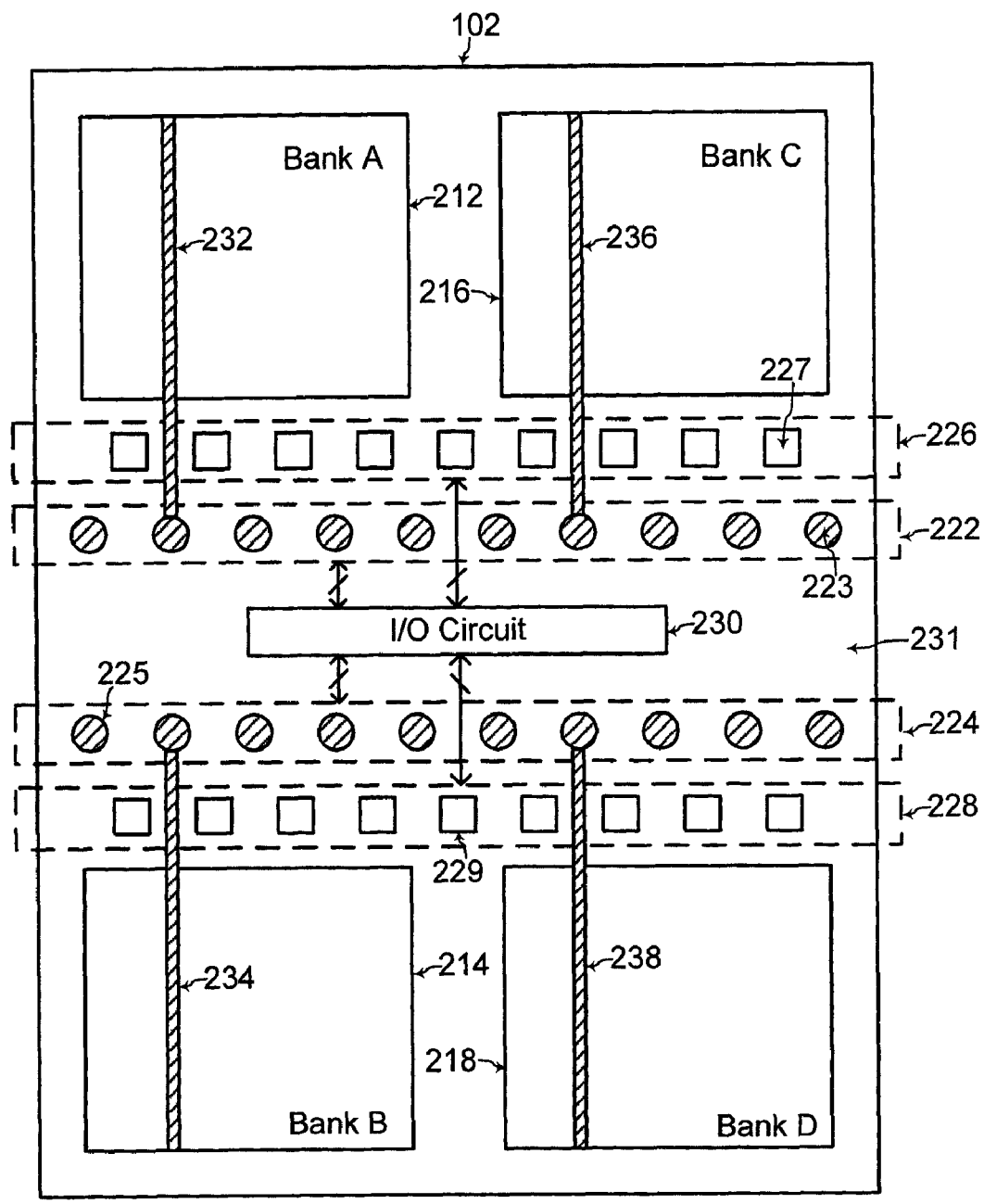
FIG. 6 shows a top view of a master chip in the three dimensional memory module of FIG. 1, according to an example embodiment of the present invention.

FIG. 6 shows a top view of the master chip 102 in the three dimensional memory module 100 of FIG. 1, according to an example embodiment of the present invention. The master chip 102 includes a first memory bank 212, a second memory bank 214, a third memory bank 216, and a fourth memory bank 218 of memory cells forming the memory core 134 of the master chip 102.

FIG. 6 also shows a first TSV (through semiconductor via) area 222 having a plurality of TSVs (through semiconductor vias) 223 formed in parallel through the semiconductor substrate of the master chip 102. In addition in FIG. 6, a second TSV (through semiconductor via) area 224 has a plurality of TSVs (through semiconductor vias) 225 formed in parallel through the semiconductor substrate of the master chip 102.

A first internal interconnect 232 is formed from a TSV (through semiconductor via) of the first TSV area 222 to at least one node of the first memory bank 212 that is disposed near the first TSV area 222. Similarly, a second internal interconnect 234 is formed from a TSV (through semiconductor via) of the second TSV area 224 to at least one node of the second memory bank 214 that is disposed near the second TSV area 224. Also, a third internal interconnect 236 is formed from another TSV (through semiconductor via) of the first TSV area 222 to at least one node of the third memory bank 216 that is disposed near the first TSV area 222. Further, a fourth internal interconnect 238 is formed from another TSV (through semiconductor via) of the second TSV area 224 to at least one node of the fourth memory bank 218 that is disposed near the second TSV area 224.

FIG. 6 further shows a first I/O (input/output) pad area 226 having a plurality of I/O (input/output) pads 227 formed onto the semiconductor substrate of the master chip 102. In addition in FIG. 6, a second I/O (input/output) pad area 228 has a plurality of I/O (input/output) pads 229 formed onto the semiconductor substrate of the master chip 102. In addition, an I/O (input/output) circuit 230 is formed in a center area 231 of the semiconductor substrate of the master chip 102.

The center area 231 is disposed between the first and second TSV areas 222 and 224. The I/O circuit 230 switches the signals between the I/O pads 227 and 229 and the TSVs 225 and 227. The memory controller 130 generates command, address, and data signals applied on the I/O pads 227 and 229 of the master chip 102.

The cross-sectional view of FIG. 1 is for the three dimensional memory module 100 with the master chip 102 being configured to be faced up. Thus, the integrated circuit for the master chip 102 is fabricated on the first face FA that faces away from the substrate 104 and toward the first slave chip 106. In that case, the TSVs 112 are formed onto the first face FA of the master chip 102 and not through the semiconductor substrate of the master chip 102. Such TSVs 112 are formed onto an interconnect structure formed on the first face FA of the master chip 102 for interconnecting the master chip 102 with the slave chips 106, 108, and 110.

Figure 7:
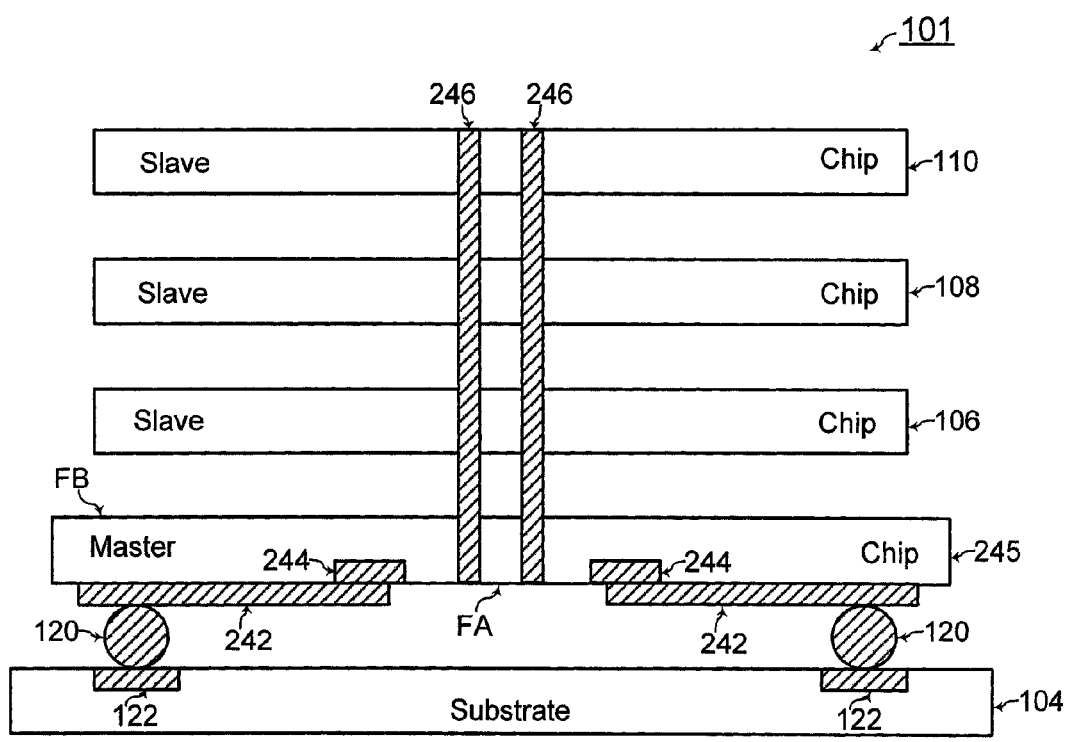
FIG. 7 shows a cross-sectional view of a three dimensional memory module with a master chip being faced down, according to an example embodiment of the present invention.

In contrast, FIG. 7 shows a cross-sectional view of a three dimensional memory module 101 with a master chip 245 being configured to be faced down, according to an alternative embodiment of the present invention. In that case in FIG.

7, the integrated circuit for the master chip 245 is fabricated on the first face FA that faces toward the substrate 104 and away from the first slave chip 106. Referring to FIG. 7, a first interconnect layer 242 and a second interconnect layer 244 are fabricated on the first face FA of the master chip 245.

In FIG. 7, TSVs (through semiconductor vias, i.e., through electrodes) 246 are formed through the respective semiconductor substrates of the slave chips 106, 108, and 110 and the master chip 102. Such TSVs 246 are formed onto interconnect structures formed on the first face FA of the master chip 102 for interconnecting the master chip 102 with the slave chips 106, 108, and 110.

According to an aspect of the present invention, multiple memory banks, multiple ranks, and/or multiple bank groups are formed in the three dimensional memory module 100 of FIG. 1 or 101 of FIG. 7. The memory cells of the memory cores 134, 136, 138, and 140 in the master and slave chips 102, 106, 108, and 110 may be organized to have multiple memory banks such that any two such memory banks are accessed sequentially with a delay time of $t_{CCD\_Long}$ between such sequential accesses.

In addition, the memory cells of the memory cores 134, 136, 138, and 140 in the master and slave chips 102, 106, 108, and 110 may be organized to have multiple bank groups such that any two such bank groups are accessed sequentially with a delay time of $t_{CCD\_Short}$ between such sequential accesses. Each bank group is comprised of a plurality of memory banks, and the delay time of $t_{CCD\_Short}$ for access between bank groups is shorter than the delay time of $t_{CCD\_Long}$ for access between memory banks.

Furthermore, the memory cells of the memory cores 134, 136, 138, and 140 in the master and slave chips 102, 106, 108, and 110 may be organized to have multiple ranks. The multiple ranks share address and command pins for access but chip select (CS) pins are used to specify which rank is being accessed for minimizing the total number of pins. The concepts of forming multiple memory banks, multiple bank groups, or multiple ranks, individually and in general, are known to one of ordinary skill in the art of memory technology.

In FIGS. 2 and 3, the master memory core 134 of the master chip 102 as well as the slave memory cores 136, 138, and 140 of the slave chips 106, 108, and 110 form at least one memory bank, bank group, and/or rank of the three dimensional memory module 100. Thus, the master memory core 134 of the master chip 102 and the slave memory cores 136, 138, and 140 of the slave chips 106, 108, and 110 comprise a total capacity of the three dimensional memory module 100 available for access by the memory controller 130 for data storage.

Figure 8A:
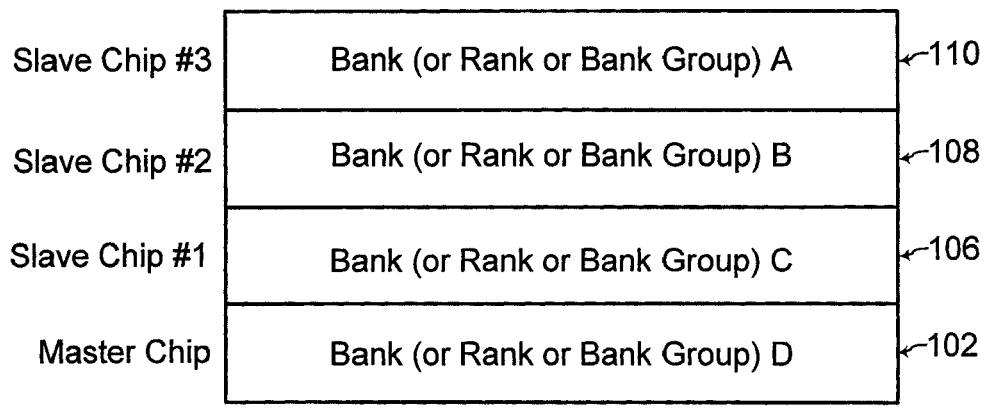
FIGS. 8A, 8B, 8C, and 8D illustrate capacity organization for the three dimensional memory system having multiple memory banks, bank groups, and/or ranks, according to an example embodiment of the present invention.

FIG. 8A illustrates an embodiment of the three dimensional memory system having multiple memory banks (or multiple bank groups or multiple ranks) with each memory bank (or each bank group or each rank) being formed entirely within a respective one of the master and slave chips 102, 106, 108, and 110. In addition in FIG. 8A, each of the master and slave chips 102, 106, 108, and 110 has just one respective memory bank (or respective bank group or respective rank) formed therein.

Figure 8B:
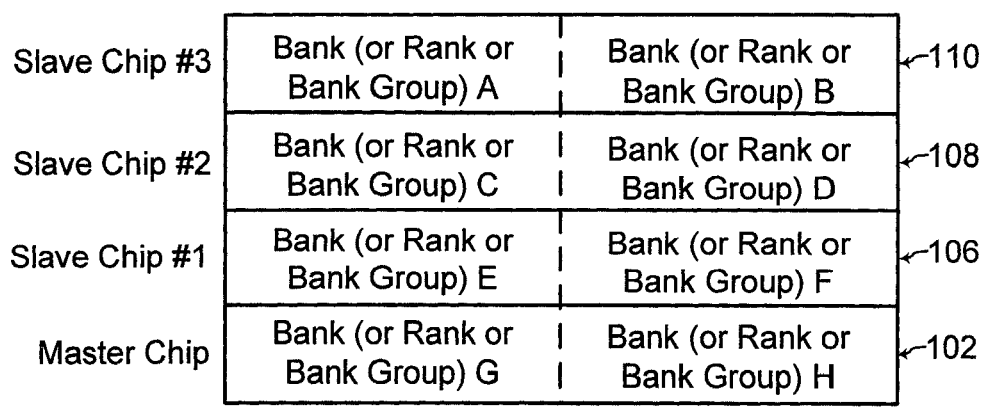

FIG. 8B illustrates an embodiment of the three dimensional memory system having multiple memory banks (or multiple bank groups or multiple ranks) being formed entirely within a respective one of the master and slave chips 102, 106, 108, and 110. In addition in FIG. 8A, each of the master and slave chips 102, 106, 108, and 110 has different respective multiple memory banks (or different respective multiple bank groups or different respective multiple ranks) formed therein.

Figure 8C:
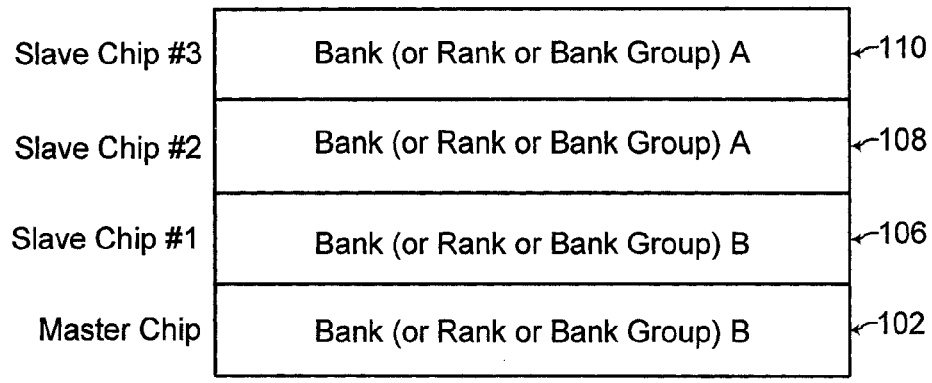

FIG. 8C illustrates an embodiment of the three dimensional memory system having multiple memory banks (or multiple bank groups or multiple ranks) with each memory bank (or each bank group or each rank) being formed within multiple chips of the master and slave chips 102, 106, 108, and 110. In addition in FIG. 8C, each of the master and slave chips 102, 106, 108, and 110 has a portion of just one respective memory bank (or respective bank group or respective rank) formed therein.

Figure 8D:
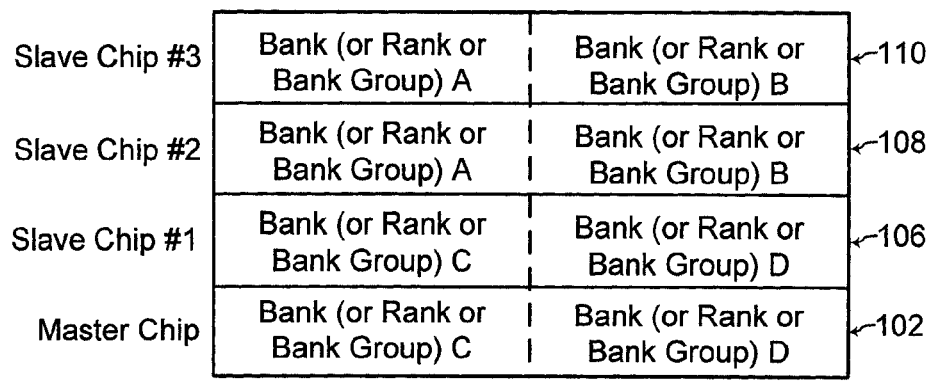

FIG. 8D also illustrates an embodiment of the three dimensional memory system having multiple memory banks (or multiple bank groups or multiple ranks) with each memory bank (or each bank group or each rank) being formed within multiple chips of the master and slave chips 102, 106, 108, and 110. Furthermore in FIG. 8D, each of the master and slave chips 102, 106, 108, and 110 has portions of multiple respective memory banks (or multiple respective bank groups or multiple respective ranks) formed therein.

Figure 9:
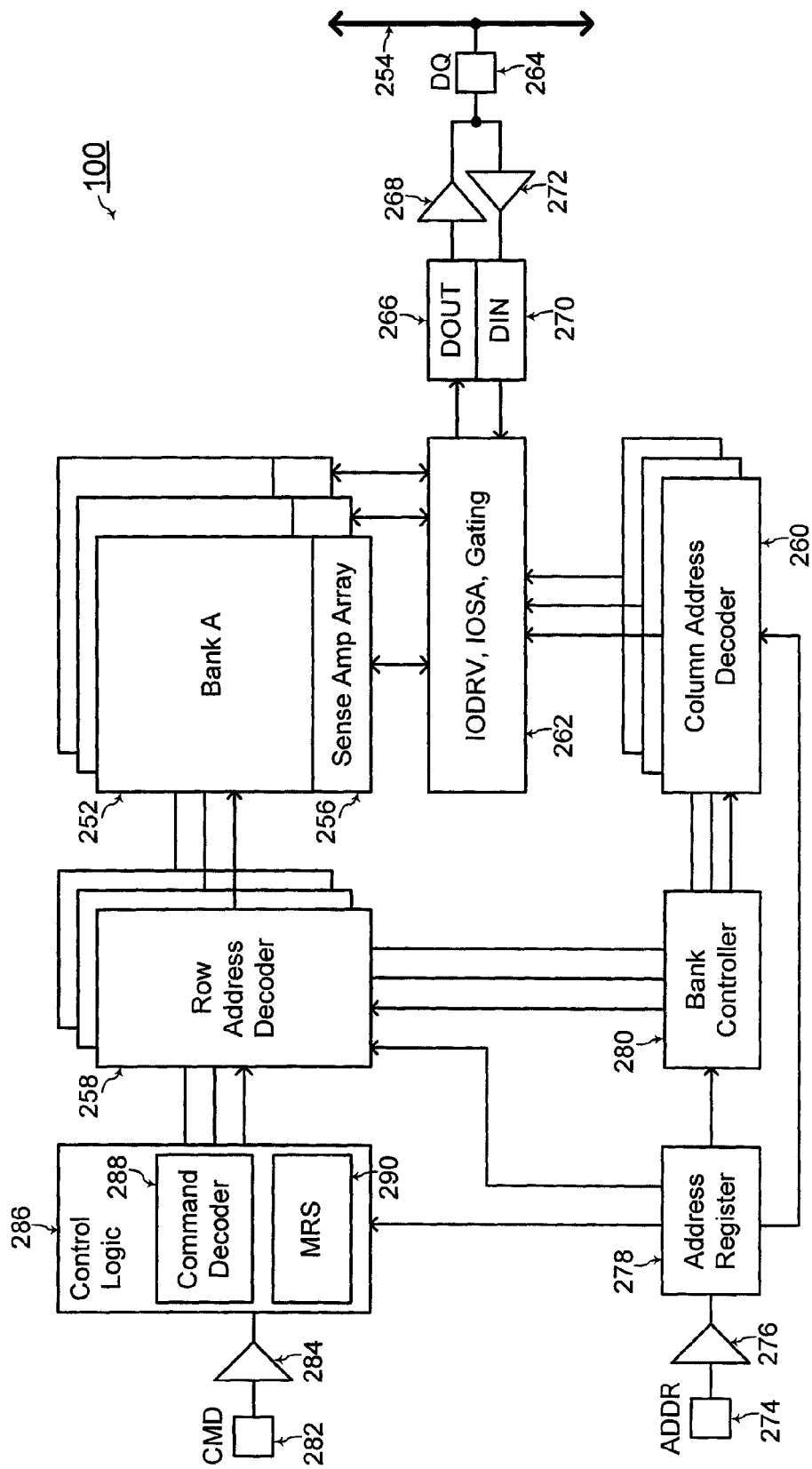
FIG. 9 shows a block diagram of a memory system having multiple memory banks with a bidirectional external data bus, according to an example embodiment of the present invention.

FIG. 9 shows a block diagram of the three dimensional memory module 100 of FIG. 1 (or 101 of FIG. 7) having multiple memory banks 252 with a bidirectional external data bus 254, according to an example embodiment of the present invention. A respective sense amplifier array 256, a respective row address decoder 258, and a respective column address decoder 260 are formed for each of the memory banks 252.

An I/O (input/output) driver, an I/O (input/output) sense amplifier, and gate unit 262 is controlled by the respective column address decoder 260 for accessing specified bit lines of a selected memory bank. A data pad 264 is coupled to the bidirectional external data bus 254. A data serializer 266 and an output buffer 268 are coupled between the gating unit 262 and the data pad 264, and a data deserializer 270 and an input buffer 272 are coupled between the gating unit 262 and the data pad 264.

An address pad 274 and an address buffer 276 receive an address of the memory banks 252 to be accessed from the memory controller 130 for storage in an address register 278. A bank controller 280 decodes a bank address portion of such an address stored in the address register 278 for controlling a selected one of the row address decoders 258 and a selected one of the column address decoders 260 to access the memory cell(s) in the memory banks 252 corresponding to the address specified in the address register 278. The selected row address decoder 258 decodes a row address portion of such an address, and the selected column address decoder 260 decodes a column address portion of such an address for such access to the memory cell(s) in the memory banks 252 corresponding to the address specified in the address register 278.

A command pad 282 and a command buffer 284 receive a command for access to such memory cell(s) in the memory banks 252 corresponding to the address specified in the address register 278. A control logic 286 including a command decoder 288 and a MRS (mode register set) decodes such a command to control the selected row address decoder to execute the command on the memory cell(s) in the memory banks 252 corresponding to the address specified in the address register 278.

FIG. 9 shows the three dimensional memory module 100 having multiple memory banks 252 but not multiple bank groups. The multiple memory banks 252 share the gating unit 262 such that sequential access between two different memory banks has a longer time margin of $t_{CCD\_Long}$ during memory bank to memory bank interleaving.

Figure 10:
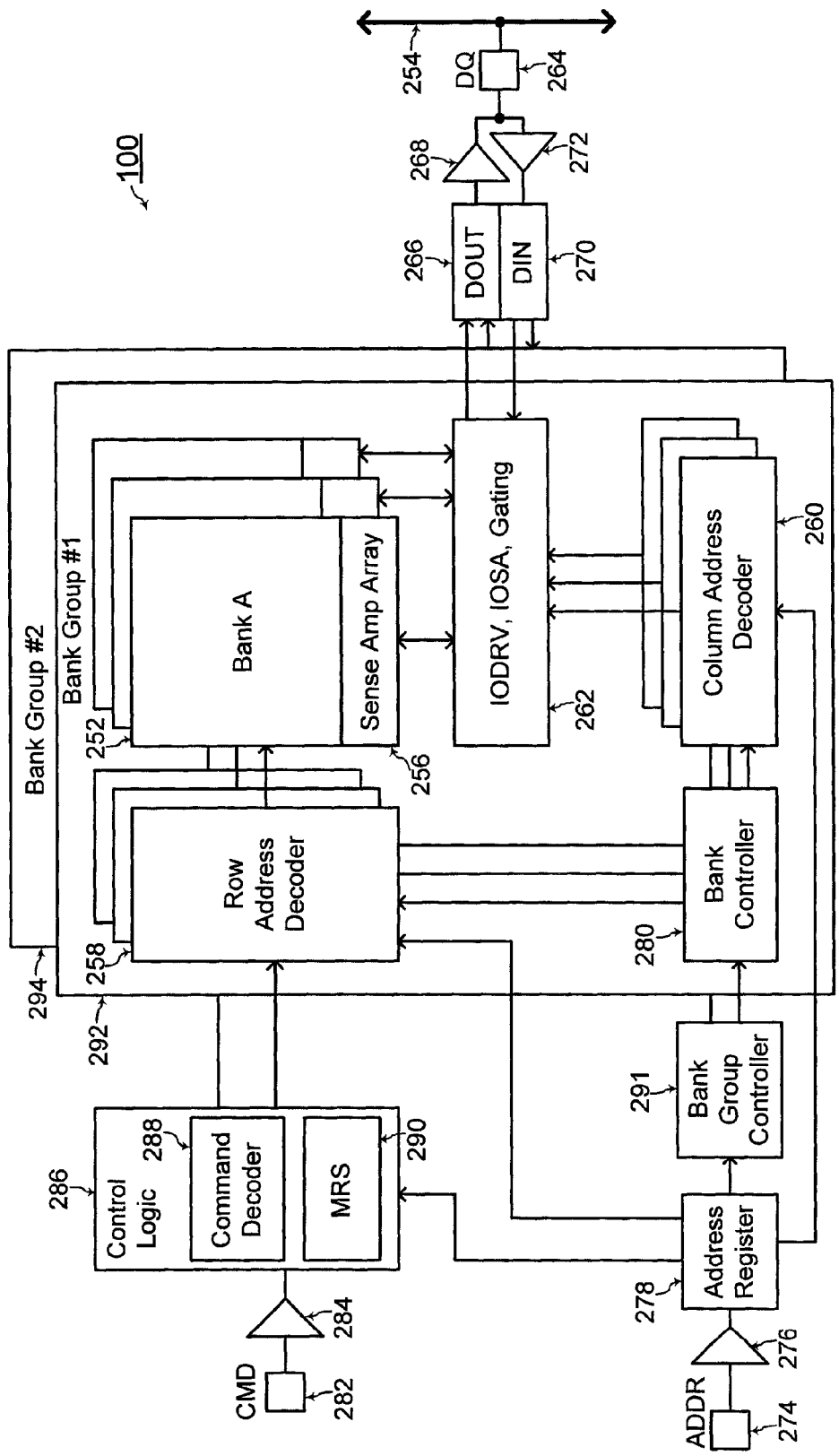
FIG. 10 shows a block diagram of a memory system having multiple bank groups with a bidirectional external data bus, according to an example embodiment of the present invention.

In contrast, FIG. 10 shows a block diagram of the three dimensional memory module 100 of FIG. 1 (or 101 of FIG. 7) having multiple bank groups including a first bank group 292 and a second bank group 294 with the bidirectional external data bus 254, according to another embodiment of the present invention. Elements having the same reference number in FIGS. 9 and 10 refer to elements having similar structure and/or function. Thus, FIG. 10 shows the respective row address decoders 258, the respective multiple memory banks 252 with the sense amp arrays 256, the respective gating unit 262, the respective column address decoders 260, and the respective bank controller 280 for the first bank group 292.

However, the second bank group 294 also includes separate respective row address decoders, respective multiple memory banks with sense amp arrays, a respective gating unit, respective column address decoders, and a respective bank controller (not shown in FIG. 10). In addition, the three dimensional memory module 100 of FIG. 10 also includes a bank group controller that decodes a bank group address portion of the address stored in the address register 278 for controlling the bank controller 280 corresponding to a selected one of the bank groups 292 and 294 as indicated by such a bank group address portion.

In FIG. 10, each of the bank groups 292 and 294 has a respective gating unit 262 such that the sequential access between two different bank groups 292 and 294 has a shorter time margin of $t_{CCD\_Short}$ during bank group to bank group interleaving. In contrast, the memory banks 252 within one bank group share the gating unit 262 such that sequential access between two different memory banks 252 has a longer time margin of $t_{CCD\_Long}$ during memory bank to memory bank interleaving.

Figure 11:
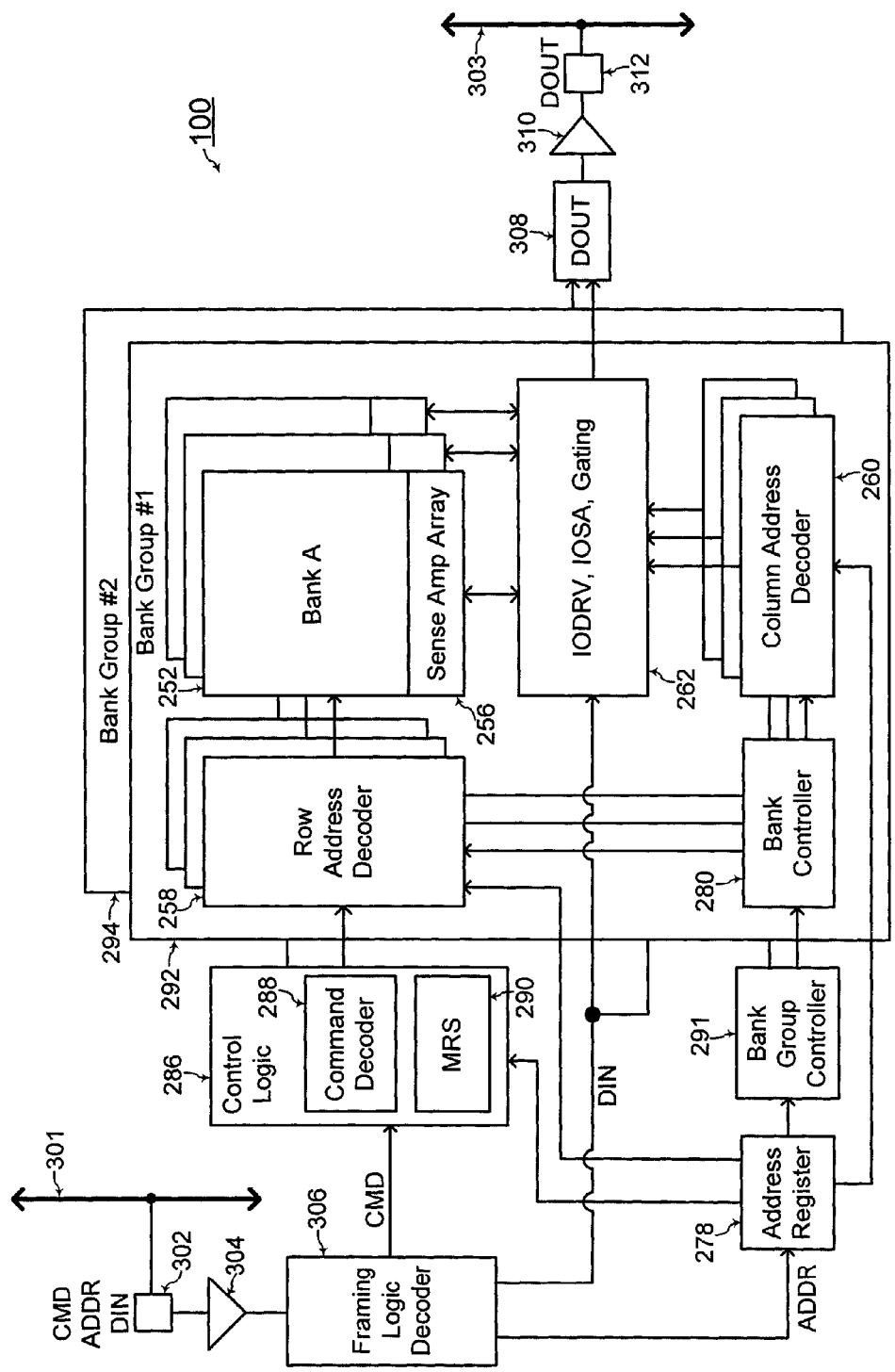
FIG. 11 shows a block diagram of a memory system having multiple bank groups with unidirectional external data buses, according to another embodiment of the present invention.

FIG. 11 shows a block diagram of the three dimensional memory module 100 of FIG. 1 (or 101 of FIG. 7) having the multiple bank groups 292 and 294 with unidirectional external data buses 301 and 302, according to another embodiment of the present invention. Elements having the same reference number in FIGS. 10 and 11 refer to elements having similar structure and/or function.

However in FIG. 11, an input data pad 302 and an input buffer 304 receive a command, an address, and input data from a unidirectional write external data bus 301. Such a command, address, and input data may be organized as a data frame that is decoded by a framing logic decoder 306. The framing logic decoder 306 extracts the command CMD that is decoded by the control logic 286, the address ADDR that is stored in the address register 278, and input data DIN that is sent to the respective gating units 262 of the bank groups.

In FIG. 11, the memory controller 130 transmits a respective rank identification unit within the data frame sent to the master chip 102 for accessing each rank when the memory controller 130 and the master chip 102 are coupled via unidirectional data buses. Alternatively, the memory controller 130 activates a respective chip select signal sent to the master chip 102 for accessing each rank when the memory controller 130 and the master chip 102 are coupled via a bidirectional data bus.

Furthermore in FIG. 11, an output buffer 310 and an output pad 312 are coupled between a serializer 308 and a unidirectional read external data bus 301. The gating unit 262 of the selected bank group being accessed outputs parallel data bits that are serialized by the serializer 308 and output to the unidirectional read external data bus 301 by the output buffer 308 and the output pad 312 for a read access to the three dimensional memory module 100.

Figure 12:
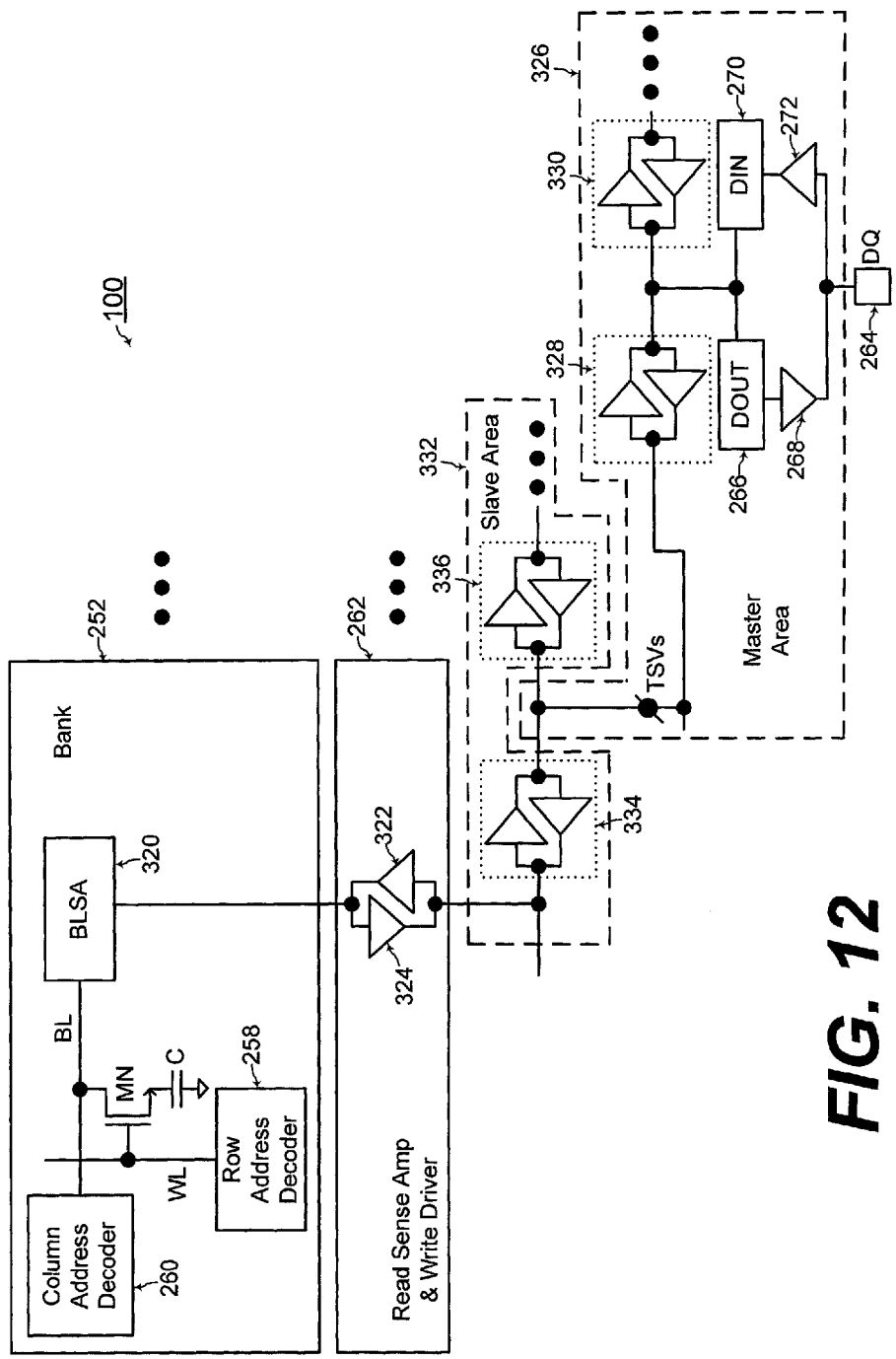
FIG. 12 shows a further block diagram of components in a slave chip and a master chip in the three dimensional memory module of FIG. 1 with a bidirectional external data bus, according to an example embodiment of the present invention.

FIG. 12 shows a further block diagram of components in the example memory bank 252 of an example slave chip 106 and the master chip 102 in the three dimensional memory module 100 of FIG. 1 (or 101 of FIG. 7) with a bidirectional external data bus such as 254 in FIG. 9 or FIG. 10 for example.

FIG. 12 shows an example memory cell C with an access field effect transistor MN having a gate connected to a word line WL and having a drain connected to a bit line BL. The column address decoder 260 controls access to the bit line BL. The row address decoder 258 controls access to the word line WL. A bit line sense amplifier (BLSA) 320 senses a bit data at the bit line BL or applies a voltage corresponding to a received bit data on the bit line BL.

The gating unit 262 includes an I/O (input/output) write driver 322 for transferring to the BLSA 320 the bit data to be written to the example memory cell C. The gating unit 262 also includes an I/O (input/output) sense amplifier 324 for transferring from the BLSA 320 the bit data read from the example memory cell C.

FIG. 12 also illustrates that master internal data buses considered to be within a master area 326 (shown outlined in dashed lines in FIG. 12) include the interconnect between the serializer 260 and the deserializer 270 and gating units 328 and 330 fabricated on the master chip 102. The master internal data buses considered to be within a master area 326 also include the TSVs (through semiconductor vias) 112 of FIG. 1 (or 246 of FIG. 7) connecting the master chip 102 to the slave chips 106, 108, and 110.

FIG. 12 further illustrates that slave internal data buses considered to be within a slave area 332 (shown outlined in dashed lines in FIG. 12) includes the interconnect between the gating unit 262 having the sense amplifier 324 and the write driver 322 and a respective gating unit 334 coupled to the TSVs. FIG. 12 shows another gating unit 336 coupled to the TSVs for another set of sense amplifier and write driver (not shown in FIG. 12).

In the example of the bidirectional external data bus 254 in FIG. 12, the internal data buses within both of the master area 326 and the slave area 332 are formed to be bidirectional. A bidirectional data bus transmits bit data in either one of two directions at a given time: (1) from the memory bank 252 to the data pad 264 for a read operation; and (2) from the data pad 264 to the memory bank 252 for a write operation. Another words, a bidirectional data bus transmits write data and read data at different times.

Figure 38:
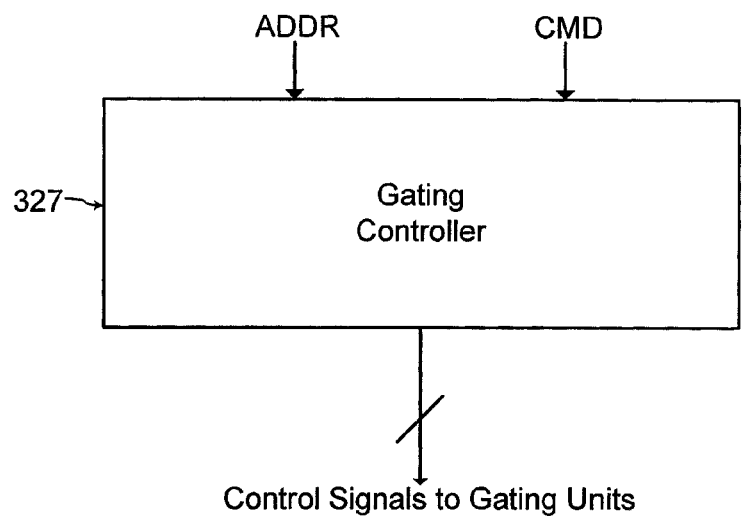
FIG. 38 illustrates an additional gating controller included in the three dimensional memory module of FIG. 1, according to an example embodiment of the present invention.

The gating units 262, 334, 336, 328, and 330 are controlled by a gating controller 327 of FIG. 38 to set such a direction of bit data transmission between the memory bank 252 and the bidirectional data pad 264 from the command CMD and the address ADDR of the memory cell C being accessed. The gating controller 327 may be formed as part of the row address decoder 258 in an example embodiment of the present invention.

Figure 13:
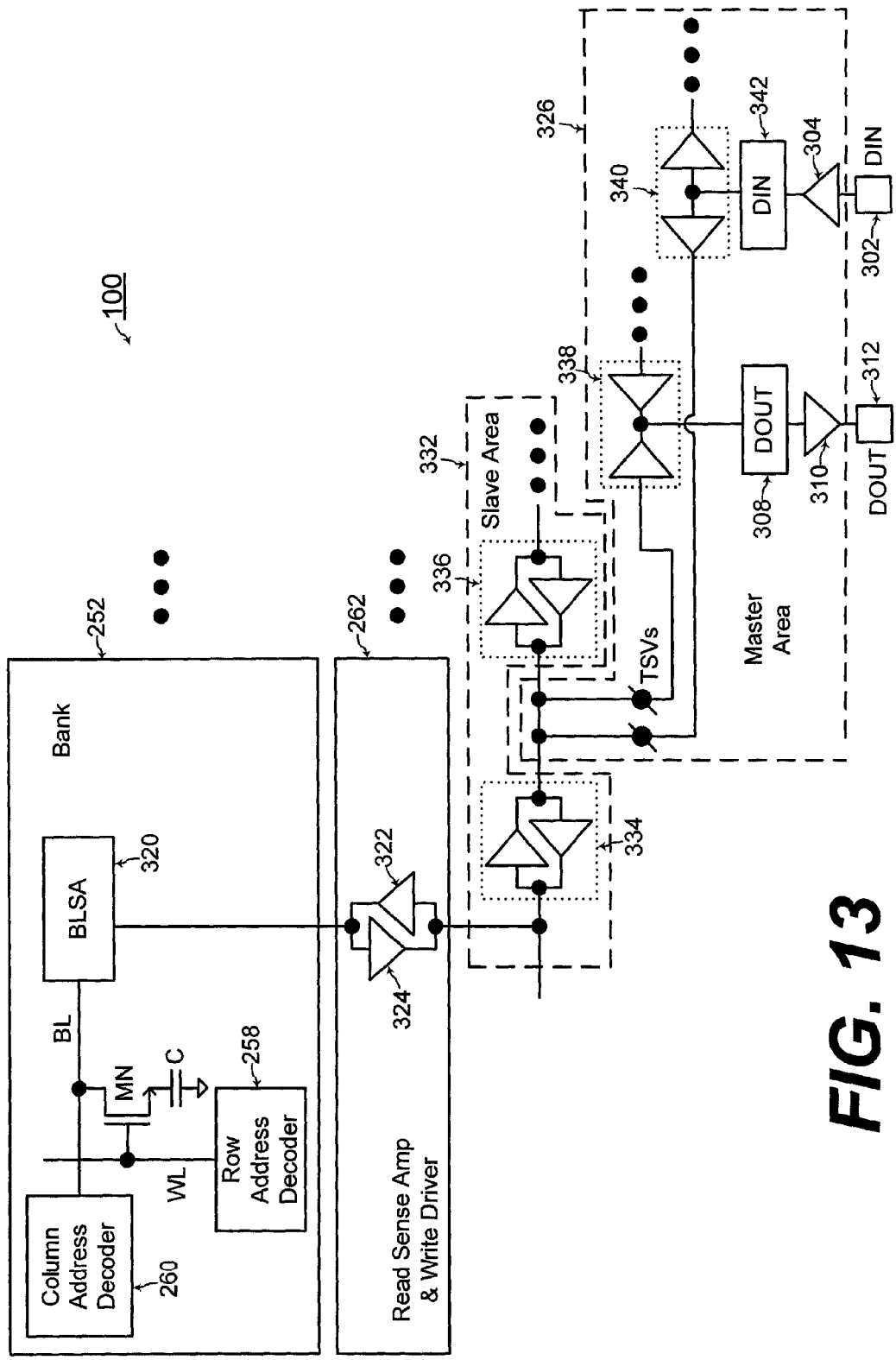
FIG. 13 shows a further block diagram of components in a slave chip and a master chip in the three dimensional memory module of FIG. 1 with unidirectional external data buses, according to another embodiment of the present invention.

FIG. 13 shows a block diagram of components in the example memory bank 252 of an example slave chip 106 and the master chip 102 in the three dimensional memory module 100 of FIG. 1 (or 101 of FIG. 7) with unidirectional external data buses such as 301 and 302 in FIG. 11 for example. Elements having the same reference number in FIGS. 12 and 13 refer to elements having similar structure and/or function. However in FIG. 13, the internal data buses within the master area 326 are unidirectional. A unidirectional data bus is dedicated to transmit bit data in only one direction at all times: (1) from the memory bank 252 to the output data pad 312 for a read operation; or (2) from the input data pad 302 to the memory bank 252 for a write operation.

The master area 326 in FIG. 13 includes a gating unit 338 coupled between unidirectional read TSVs and the serializer 308 for coupling a selected memory bank to the serializer 308. The master area 326 in FIG. 13 also includes a gating unit 340 coupled between unidirectional write TSVs and a deserializer 342 for coupling a selected memory bank to the deserializer 342. The deserializer 342 in FIG. 13 may be formed as part of the framing logic decoder 306 in FIG. 11.

In the example of the unidirectional external data buses 301 and 302 in FIGS. 11 and 13, the internal data buses within the master area 326 are unidirectional while the internal data buses within the slave area 332 are bidirectional. The gating units 262, 334, 336, 338, and 340 are controlled by the gating controller 327 of FIG. 38 to set such a path of bit data transmission between the memory bank 252 and the unidirectional data pads 312 and 302 from the command CMD and the address ADDR of the memory cell C being accessed. The gating controller 327 may be formed as part of the row address decoder 258 in an example embodiment of the present invention.

Separate unidirectional data buses for read and write operations are desirable for allowing simultaneous read and write operations. However, separate unidirectional data buses increase the total number of interconnect lines.

In an embodiment of the present invention, the internal data buses within the master area 326 are desired to include separate unidirectional data buses for read and write operations when multiple ranks are formed in the three dimensional memory module 100 of FIG. 1 (or 101 of FIG. 7), according to an embodiment of the present invention. The desirability of such unidirectional internal data buses in the master area 326 for the multiple ranks is illustrated with the timing diagrams of FIGS. 14, 15, and 16.

Figure 14:
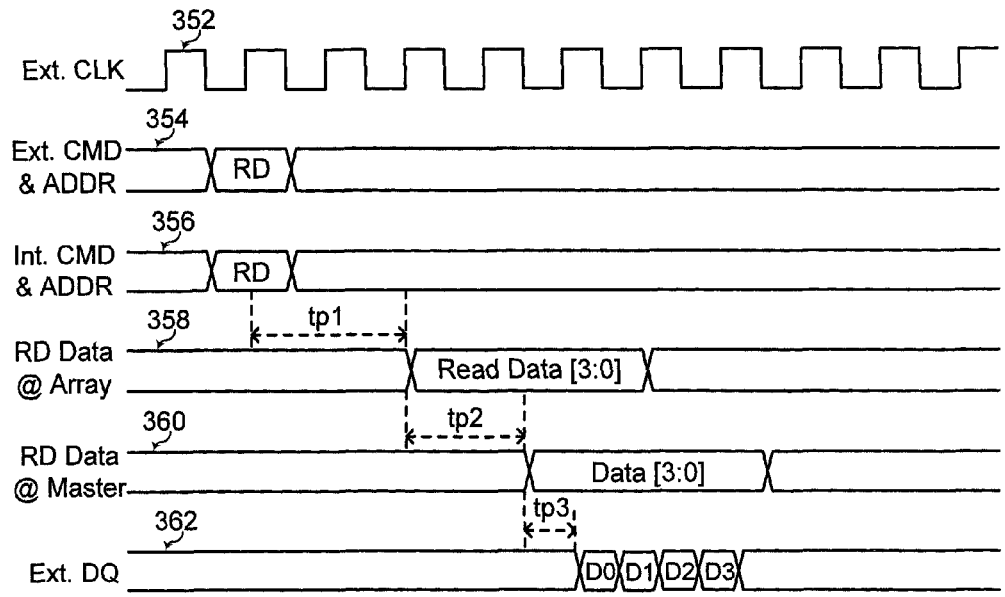
FIGS. 14, 15, and 16 are timing diagrams illustrating advantageous use of unidirectional data buses in the master chip when multiple ranks are formed in the three-dimensional memory system, according to an example embodiment of the present invention.

FIG. 14 shows a timing diagram of signals when the three dimensional memory module 100 executes a read command RD. Referring to FIGS. 2, 10, and 14 for example, the memory controller 130 generates a read command RD with an address of the selected memory cells to be read from, in synchronization with an external clock signal 352. The external read command RD and address signals 354 are input to generate internal read command RD and address signals 356 within the three dimensional memory module 100.

After an address decoding time period tp1 from the read command RD being internally generated by the three dimensional memory module 100, read data [3:0] 358 is generated at the selected memory bank (i.e., array) of memory cells in one of the master and slave chips 102, 106, 108, or 110. After a data propagation time period tp2, the read data [3:0] from the selected memory bank arrive as propagated data [3:0] 360 at the serializer 266 in the master area 326 of the master chip 102. After a data serialization time period tp3, the data [3:0] is serialized into a series of bits D0, D1, D2, and D3 362 that is output at the data pad 264.

Figure 15:
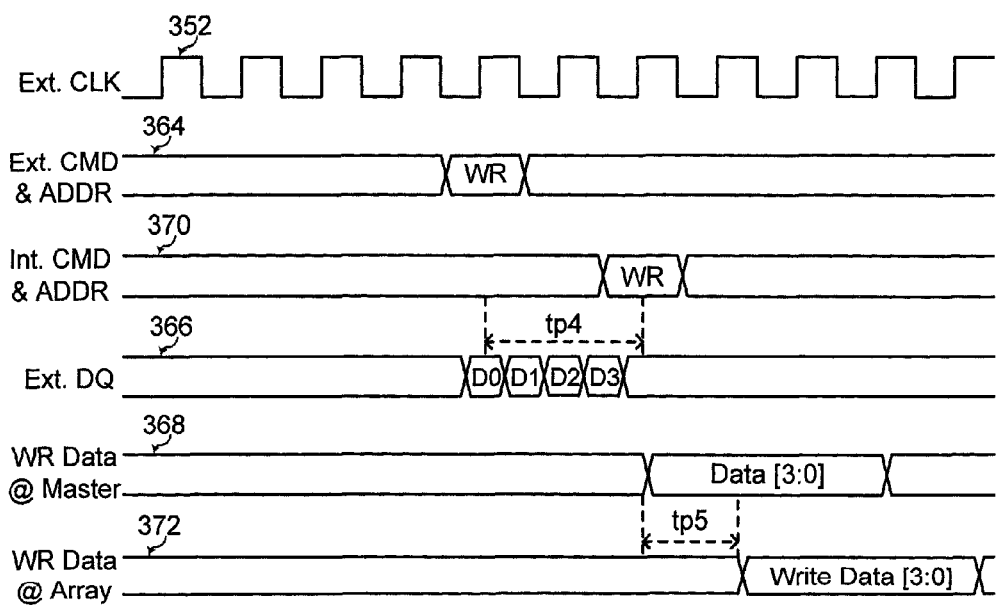

FIG. 15 shows a timing diagram of signals when the three dimensional memory module 100 executes a write command WR. Referring to FIGS. 2, 10, and 14 for example, the memory controller 130 generates a write command WR 364 along with a series of bits D0, D1, D2, and D3 366 to be written to an address of the selected memory cells in synchronization with the external clock signal 352. The series of bits D0, D1, D2, and D3 are deserialized into parallel write data [3:0] 368 by the deserializer 270 after a data parallelization time period tp4.

The external write command WR and address signals 364 are also input as internal write command WR and address signals 370 by the three dimensional memory module 100 after the data parallelization time period tp4. Such parallel write data [3:0] 368 at the master area 326 arrives at the selected memory bank (i.e., array) of memory cells in one of the master and slave chips 102, 106, 108, or 110 as write data [3:0] 372 after an address decoding and data propagation delay tp5 for being written into the memory cells as specified by the address.

Figure 16:
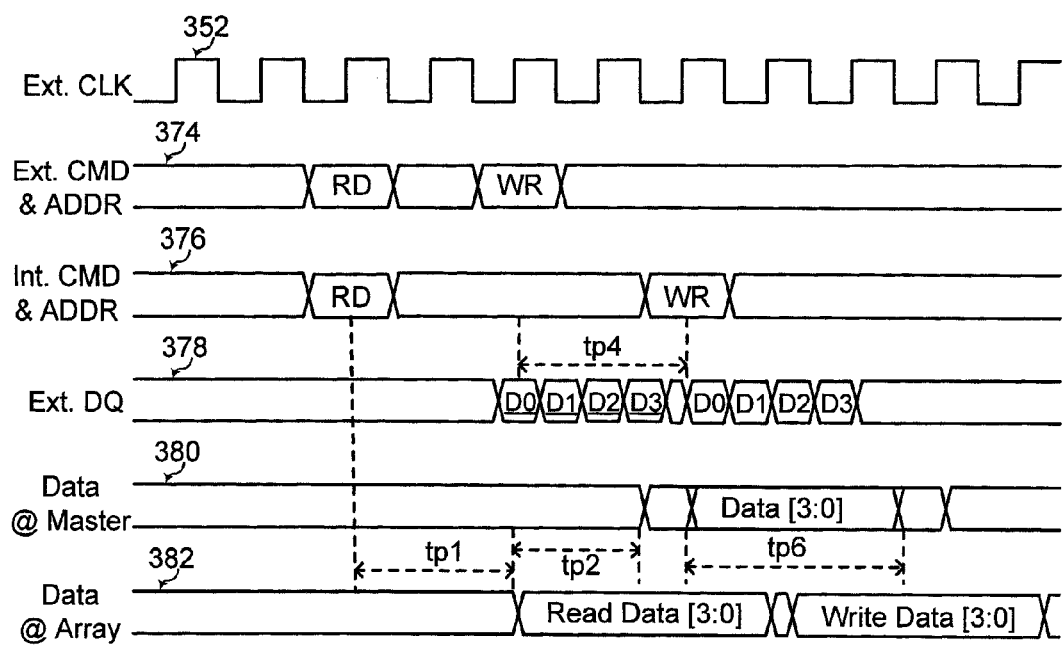

FIG. 16 shows a timing diagram of signals when the three dimensional memory module 100 executes a read command RD and a write command WR sequentially generated by the memory controller 130. The read and write commands RD and WR are generated for two different ranks of the three dimensional memory module 100 with the master area 326 having bidirectional internal data buses. FIG. 16 with both of the read and write commands RD and WR is illustrated from an overlap of FIGS. 14 and 15 with the read command RD and the write command WR, respectively.

Referring to FIGS. 3, 10, and 16 for example, the memory controller 130 sequentially generates the read command to be executed on a first rank of the three dimensional memory module 100 as indicated with an associated chip select signal and generates the write command RD to be executed on a second rank of the three dimensional memory module 100 as indicated with an associated chip select signal, in synchronization with the external clock signal 352. The external read and write commands RD and WR and address signals 374 from the memory controller 130 are input as internal read and write commands RD and WR and address signals 376 by the three dimensional memory module 100.

The external WR command is generated with sequential write data bits D0, D1, D2, and D3 to be written from the memory controller $\overline{130}$ as external data 378 at the data pad DQ 264. The internal WR command is generated as part of the internal command and address signals 376 after the data parallelization time period tp4 when the write data bits D0, D1, D2, and D3 have been deserialized by the deserializer $\overline{270}$ into an internal data signal 380 at the master area 326 (at a beginning of time period tp6 in FIG. 16). Referring to FIGS. 15 and 16, such parallel write data [3:0] 380 at the master area 326 arrives at the selected rank (i.e., array) of memory cells in one of the master and slave chips 102, 106, 108, or 110 as write data [3:0] 382 after an address decoding and data propagation delay tp5 for being written into the memory cells as specified by the address.

Referring to FIGS. 15 and 16, after an address decoding time period tp1 from the read command RD being internally generated by the three dimensional memory module 100, read data [3:0] 382 is generated at the selected rank (i.e., array) of memory cells in one of the master and slave chips 102, 106, 108, or 110. After a data propagation time period tp2, the read data [3:0] from the selected rank arrive (at end of time period tp2 in FIG. 16) as propagated read data [3:0] 380 at the serializer 266 in the master area 326 of the master chip 102. After a data serialization time period tp3, the data [3:0] is serialized into a series of bits D0, D1, D2, and D3 362 that is output at the data pad DQ 264.

In FIG. 16, note an overlap time period tp6 when the deserialized write data [3:0] and the propagated read data [3:0] simultaneously arrive at the same bidirectional internal data bus of the master area 326. As illustrated in FIG. 16, use of a same bidirectional internal data bus of the master area 326 for execution of the read and write commands RD and WR when accessing multiple ranks of the three dimensional memory module 100 disadvantageously results in collision of associated read and write data.

Accordingly as illustrated in FIG. 13, unidirectional internal data buses are formed in the master area 326 when the memory cells of the three dimensional memory module 100 are organized to have multiple ranks. In that case, separate internal data buses are formed in the master area 326 for read data and for write data as illustrated in FIG. 13 to avoid collision of such data at the master area 326.

Figure 17:
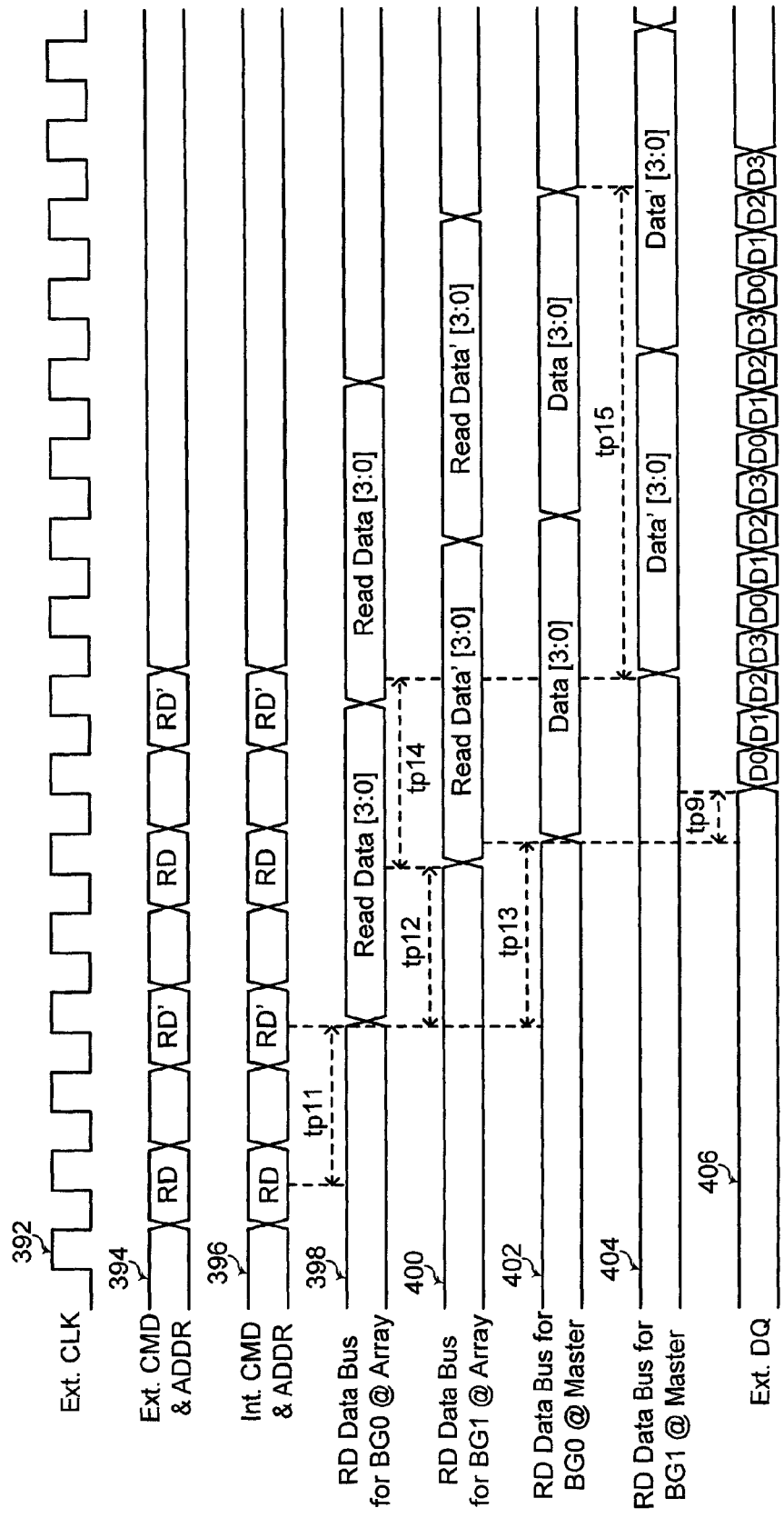
FIGS. 17 and 18 are timing diagrams illustrating advantageous use of separate buses for each bank group when multiple bank groups are formed in a rank for the three-dimensional memory system, according to an example embodiment of the present invention.

FIG. 17 shows a timing diagram of signals resulting in data collision when a same data bus is used for read commands generated for multiple bank groups BG0 and BG1 in the three dimensional memory module 100 of FIG. 1 (or 101 of FIG. 7). Referring to FIGS. 2 and 17 for example, the memory controller 130 generates a first read command RD with an address of the selected memory cells to be read from in a first bank group BG0 of the three dimensional memory module 100. The memory controller 130 subsequently generates a second read command RD' with an address of the selected memory cells to be read from in a second bank group BG1 of the three dimensional memory module 100.

FIG. 17 illustrates such read commands RD and RD' generated by the memory controller 130 as external read command and address signals 394 that is synchronized with an external clock signal 392 also generated by the memory controller 130. The external read command and address signals 394 are input to generate corresponding internal read command and address signals 396 within the three dimensional memory module 100.

After a first address decoding time period tp11 from the first read command RD being internally generated by the three dimensional memory module 100, read data [3:0] 398 is generated at the first bank group BG0 (i.e., array) of memory cells in one of the master and slave chips 102, 106, 108, or 110. After a second address decoding time period tp12 from the second read command RD' being internally generated by the three dimensional memory module 100, read data' [3:0] 400 is generated at the second bank group BG1 (i.e., array) of memory cells in one of the master and slave chips 102, 106, 108, or 110.

After a first data propagation time period tp13, the read data [3:0] from the first bank group BG0 arrive as propagated data [3:0] 402 at the serializer 266 in the master area 326 of the master chip 102. After a second data propagation time period tp14, the read data' [3:0] from the second bank group BG1 arrive as propagated data' [3:0] 404 at the serializer 266 in the master area 326 of the master chip 102. After a data serialization time period tp9, the data [3:0] and/or data' [3:0] is serialized into a series of bits D0, D1, D2, D3, and . . . 406 that is output at the data pad 264.

In FIG. 17, the read data [3:0] 402 arriving at the master area 326 from the first bank group BG0 overlaps with the read data' [3:0] 404 arriving at the master area 326 from the second bank group BG1 during a collision time period tp15. Thus, using a same shared data bus at the master area 326 for execution of read commands RD and RD' by both the first and second bank groups BG0 and BG1 disadvantageously results in collision of read data at the same shared data bus. Accordingly in an example embodiment of the present invention, separate data buses are formed in the master area 326 for each of the bank groups of the three dimensional memory module 100 of FIG. 1 (or 101 of FIG. 7).

Figure 18:
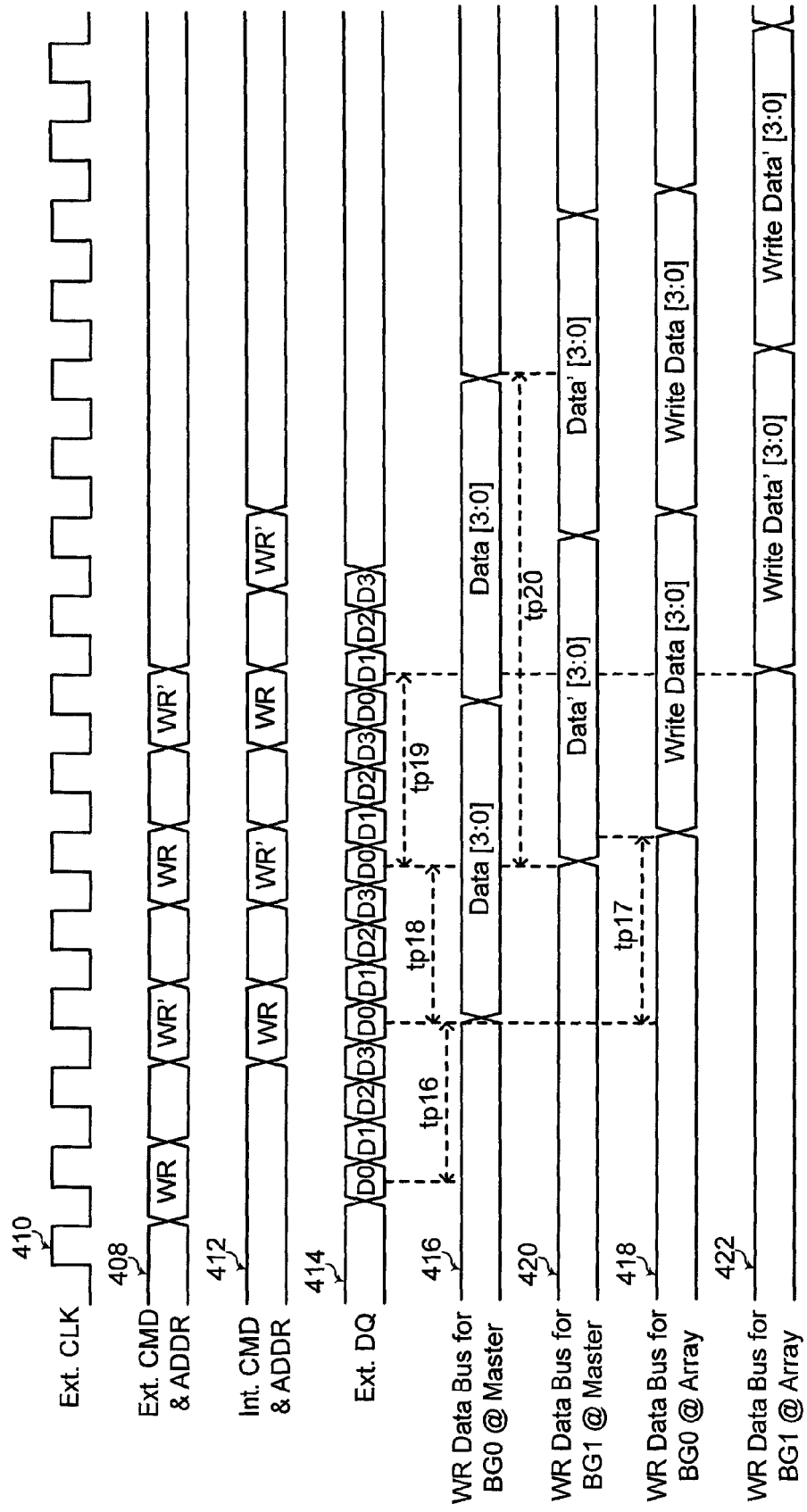

FIG. 18 shows a timing diagram of signals resulting in data collision when a same data bus is used for write commands generated for multiple bank groups BG0 and BG1 in the three dimensional memory module 100 of FIG. 1 (or 101 of FIG. 7). Referring to FIGS. 2 and 18 for example, the memory controller 130 generates a first write command WR with an address of the selected memory cells to be written to in a first bank group BG0 of the three dimensional memory module 100. The memory controller 130 subsequently generates a second write command WR' with an address of the selected memory cells to be written to in a second bank group BG1 of the three dimensional memory module 100.

FIG. 18 illustrates such write commands WR and WR' generated by the memory controller 130 as external write command and address signals 408 that is synchronized with an external clock signal 410 also generated by the memory controller 130. The external write command and address signals 408 are input to generate corresponding internal write command and address signals 412 within the three dimensional memory module 100. A first series of data bits D0, D1, D2, and D3 are generated as external data signal 414 by the memory controller 130 with the first write command WR, and a second series of data bits D0, D1, D2, and D3 are generated as the external data signal $\overline{414}$ by the memory controller 130 with the second write command WR'.

The series of bits D0, D1, D2, and D3 for the first write command WR are deserialized into parallel write data [3:0] 416 by the deserializer 270 in the master area 326 after a first data parallelization time period tp16. Such parallel write data [3:0] 416 at the master area 326 arrives at the first bank group BG0 in one of the master and slave chips 102, 106, 108, or 110 as propagated write data [3:0] 418 after a first address decoding and data propagation delay tp17 for being written into the memory cells as specified by the address.

The series of bits $\overline{D0, D1, D2,}$ and $\overline{D3}$ for the second write command WR' are $\overline{\text{deserialized}}$ into $\overline{\text{parallel}}$ write data' [3:0] 420 by the deserializer 270 in the master area 326 after a second data parallelization time period tp18. Such parallel write data' [3:0] 416 at the master area 326 arrives at the second bank group BG1 (i.e., array) in one of the master and slave chips 102, 106, 108, or 110 as propagated write data' [3:0] 422 after a second address decoding and data propagation delay tp19 for being written into the memory cells as specified by the address.

In FIG. 18, the write data [3:0] 416 deserialized at the master area 326 for the first bank group BG0 overlaps with the write data' [3:0] 420 deserialized at the master area 326 for the second bank group BG1 during a collision time period tp20. Thus, using a same shared data bus at the master area 326 for execution of write commands WR and WR' by both the first and second bank groups BG0 and BG1 disadvantageously results in collision of write data at the same shared data bus. Accordingly in an example embodiment of the present invention, separate data buses are formed in the master area 326 for each of the bank groups of the three dimensional memory module 100 of FIG. 1 (or 101 of FIG. 7).

To avoid the collision of read data or write data as illustrated in FIGS. 17 and 18, separate data buses are formed in the master area 326. A first set of such data buses in the master area 326 are dedicated for transmission of write/read data to/from the first bank group BG0. In addition, a second set of such data buses in the master area 326 are dedicated for transmission of write/read data to/from the second bank group BG1, with the first set of such data buses being electrically separate from the second set of data buses.

Figure 19:
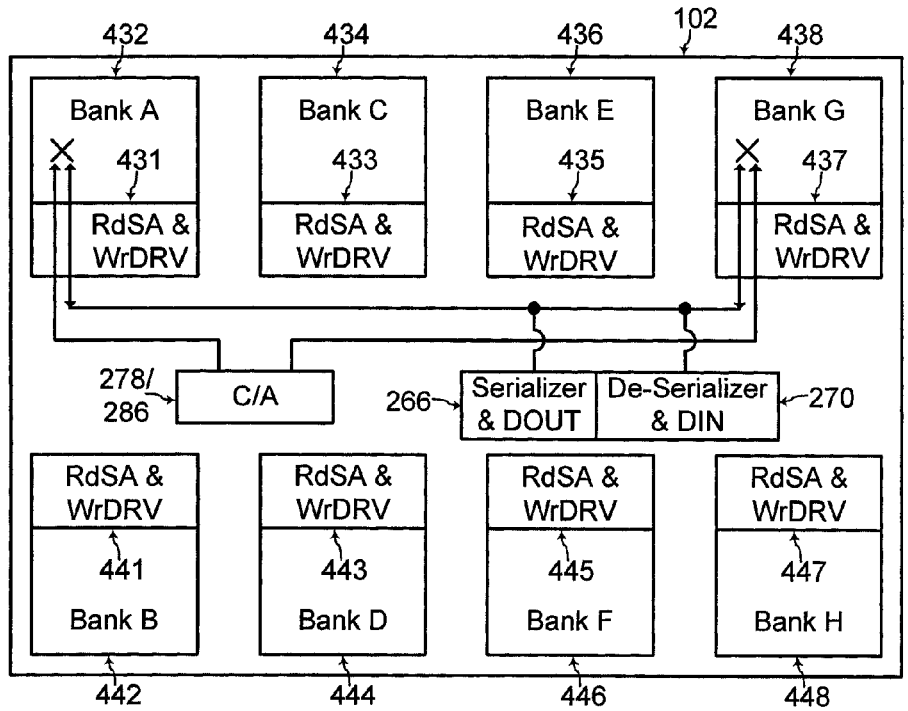
FIGS. 19 and 20 illustrate maximizing wiring length in a master chip while minimizing wiring length in a slave chip in the three dimensional memory module of FIG. 1, according to an example embodiment of the present invention.
Figure 20:
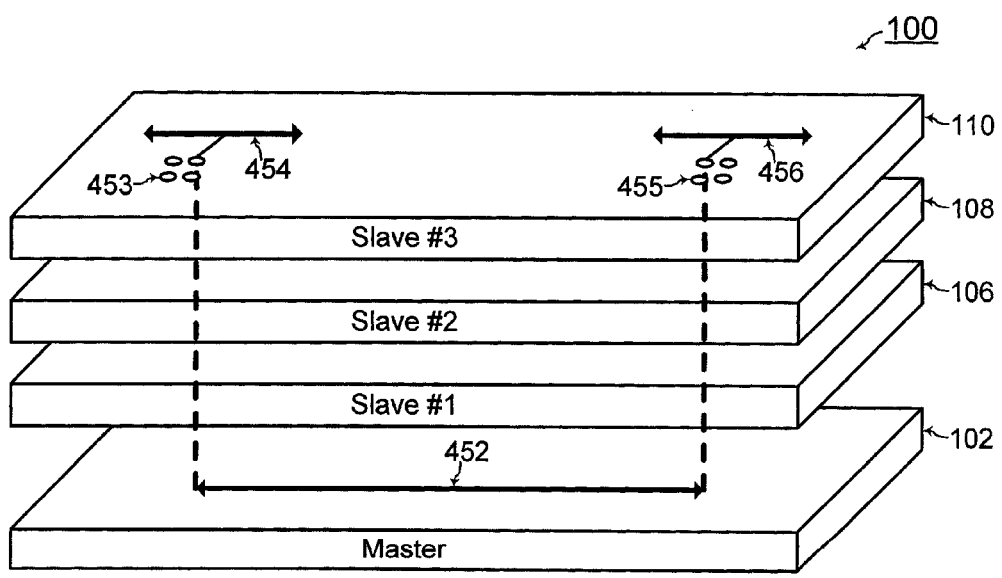

FIGS. 19 and 20 illustrate maximizing wiring length in the master chip 102 while minimizing wiring length in the slave chips 106, 108, and 110 in the three dimensional memory module 100 of FIG. 1, according to an embodiment of the present invention. FIG. 19 shows a block diagram of the master chip 102, and FIG. 20 shows a perspective view of the three dimensional memory module 100 having the master 102 of FIG. 19.

For example referring to FIGS. 9 and 19, the master chip 102 includes first, second, third, fourth, fifth, sixth, seventh, and eighth memory banks 432, 434, 436, 438, 442, 444, 446, and 448, respectively. The master chip 102 also includes respective sense amplifier and write driver units 431, 433, 435, 437, 441, 443, 445, and 447 for the memory banks 432, 434, 436, 438, 442, 444, 446, and 448, respectively.

FIGS. 19 and 20 illustrate forming a first signal path 452 on the master chip 102 and forming at least one respective second signal path 454 and 456 in each of the slave chips 454 and 456. The first signal path 452 is connected to the second signal path 454 by through electrodes (i.e. TSVs, through semiconductor vias) 453, and the first signal path 452 is connected to the second signal path 456 by through electrodes (i.e. TSVs, through semiconductor vias) 455.

The first signal path 452 is formed with at least one interconnect structure formed on the master chip 102, and each of the second signal paths 454 and 456 are formed with at least one interconnect structure formed on a respective one of the slave chips 106, 108, and 110. FIG. 20 illustrates the second signal paths 454 and 456 formed on the semiconductor substrate of the third slave chip 110. Respective signal paths similar to the second signal paths 454 and 456 are also formed in each of the slave chips 106 and 108 to be connected to the first signal path 452 by the through electrodes 453 and 455.

For example referring to FIGS. 9, 19, and 20, the first signal path 452, the TSVs 453, and the second signal path 454 is for transmission of a signal between one of the control logic 286, the address register 278, the data serializer 266, or the data deserializer 270 fabricated on the master chip 102 to a respective memory bank fabricated on a respective one of the slave chips 106, 108, and 110. Similarly, the first signal path 452, the TSVs 455, and the second signal path 456 is for transmission of a signal between one of the control logic 286, the address register 278, the data serializer 266, or the data deserializer 270 fabricated on the master chip 102 to another respective memory bank fabricated on the respective one of the slave chips 106, 108, and 110.

In the embodiment of FIGS. 19 and 20, a respective length of the first signal path 452 on the master chip 102 is maximized while the respective lengths of the second signal paths 454 and 456 on any of the slave chips 106, 108, and 110 is minimized. For example, the respective total length of the at least one interconnect structure fabricated on the semiconductor substrate of the master chip 102 for forming the first signal path 452 is maximized. On the other hand, the respective total length of the at least one interconnect structure fabricated on the semiconductor substrate of the slave chip 110 for forming the second signal path 454 or 456 is minimized.

In FIGS. 19 and 20, each of the slave chips 106, 108, and 110 receives the common signal transmitted through the first signal path 452 on the master chip 102. However, each of the slave chips 106, 108, and 110 transmits such a common signal through separate respective second signal paths such as 454 or 456. Thus, adverse effects from variation of PVT (processing parameters, voltages, and temperatures) among the chips 102, 106, 108, and 110 may be minimized by maximizing the length of the first signal path 452 on the master chip 102 while minimizing the lengths of the second signal path 454 or 456 on the slave chips 106, 108, and 110. Another words, a ratio of the length of the first signal path 452 on the master chip 102 to the length of the second signal path 454 or 456 on a slave chip is maximized according to an aspect of the present invention.

For example, the respective total length of the at least one interconnect structure fabricated on the semiconductor substrate of the master chip 102 for forming the first signal path 452 is at least two times the respective total length of the at least one interconnect structure fabricated on the semiconductor substrate of the slave chip 110 for forming the second signal path 454 or 456. FIG. 20 illustrates forming two sets of TSVs 453 and 455 for minimizing the lengths of the second signal paths 454 and 456 on the slave chips 102, 106, 108, and 110.

Figure 21:
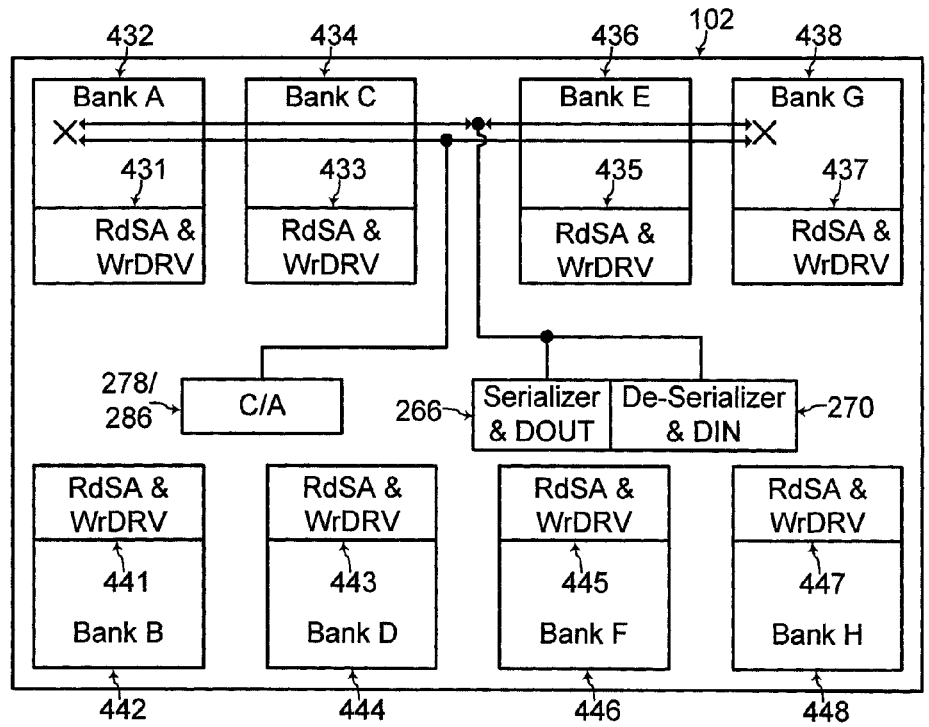
FIGS. 21 and 22 illustrate minimizing wiring length in a master chip while maximizing wiring length in a slave chip alternatively to FIGS. 19 and 20.
Figure 22:
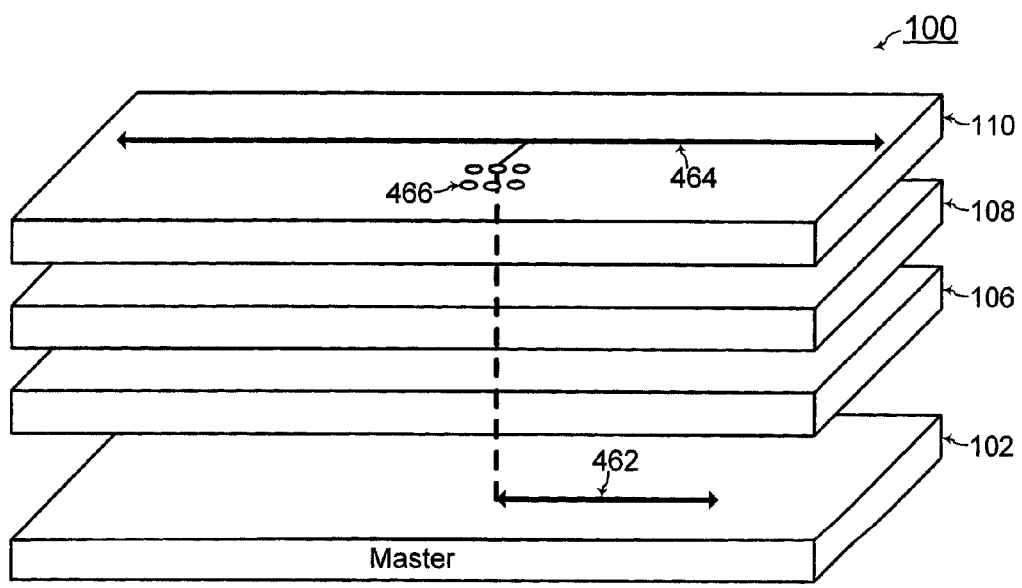

FIGS. 21 and 22 illustrate forming one set of TSVs 466 disposed toward a center of the slave chips 102, 106, 108, and 110, with a first signal path 462 formed on the master chip 102 and a second signal path 464 formed on the example slave chip 110. A respective second signal path 464 is similarly formed on each of the slave chips 106 and 108. The TSVs 466 connect the first signal path 462 formed on the master chip 102 with the respective second signal paths 464 formed on the slave chips 106, 108, and 110.

In the case of FIGS. 21 and 22, a total length of the first signal path 462 formed on the master chip 102 is decreased from the example of FIG. 20, and a total length of the second signal path 464 formed on the slave chip 110 is increased from the example of FIG. 20. Thus, the three dimensional memory module 100 of FIG. 22 is more susceptible to adverse effects from variation of PVT (processing parameters, voltages, and temperatures) among the chips 102, 106, 108, and 110. However, a fewer number of TSVs 466 may be used in the three dimensional memory module 100 of FIG. 22 than the number of TSVs 453 and 455 in the three dimensional memory module 100 of FIG. 20.

FIG. 23 shows a table of internal data bus types formed in the master area and the slave area depending on the type of external data bus, whether one rank or multiple ranks are formed, and whether one bank group or multiple bank groups are formed in the three dimensional memory module 100 of FIG. 1 (or 101 of FIG. 7). In FIG. 23, top rows 471, 472, 473, and 474 are for the case of the three dimensional memory module 100 having a bidirectional external data bus alternately transmitting both read and write data as illustrated in FIG. 12. Also in FIG. 23, bottom rows 475, 476, 477, and 478 are for the case of the three dimensional memory module 100 having unidirectional external data buses, each being dedicated to transmit one of read data or write data as illustrated in FIG. 13.

Column 479 in the table of FIG. 23 lists the type of master internal data bus in the master area 326 in FIGS. 12 and 13 including the TSVs and the internal data buses formed on the master chip 102 and connected to such TSVs. Column 480 in the table of FIG. 23 lists the type of slave internal data bus in the slave area 332 in FIGS. 12 and 13 including the internal data buses formed on the master chip 102 and the slave chips 106, 108, and 110 for connections from such TSVs to the memory cores 134, 136, 138, and 140.

Figure 24:
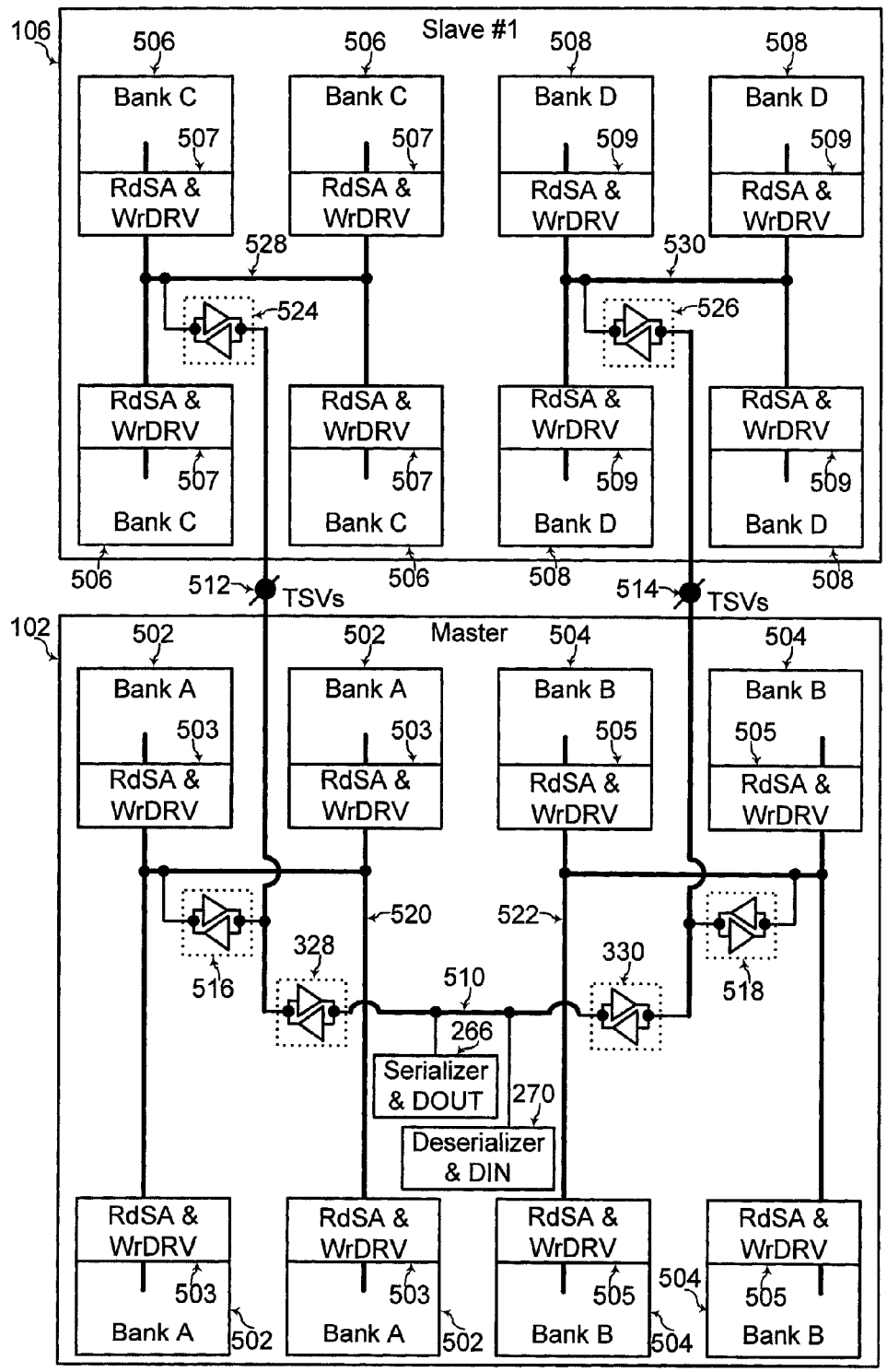
FIGS. 24 and 25 illustrate wirings formed through a master chip and a slave chip when one rank and one bank group are formed in the three dimensional memory module of FIG. 1, according to an example embodiment of the present invention.
Figure 25:
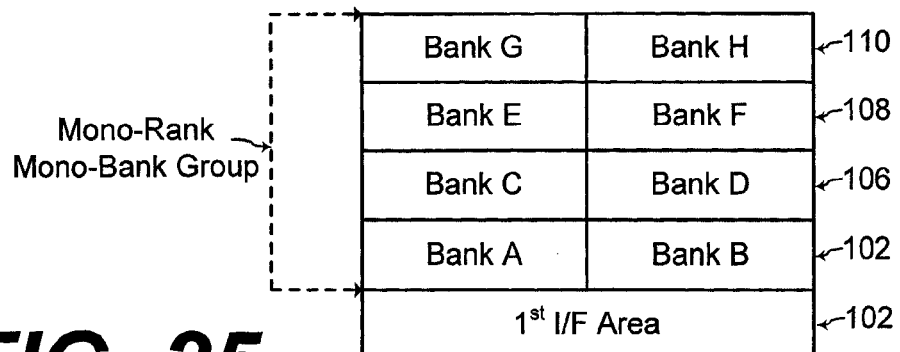

Row 471 in FIG. 23 is for the case of the three dimensional memory module 100 having one memory rank and one bank group as illustrated in FIGS. 24 and 25. Referring to FIG. 25, the first interface area between the memory controller 130 and the external I/O 132 is formed in the master chip 102. In addition, memory banks A and B are formed in the master chip 102, memory banks C and D are formed in the first slave chip 106, memory banks E and F are formed in the second slave chip 108, and memory banks G and H are formed in the third slave chip 110.

FIG. 24 shows the master chip 102 having memory bank A portions 502 with corresponding read sense amplifier and write driver units 503 and memory bank B portions 504 with corresponding read sense amplifier and write driver units 505. FIG. 24 also shows the example slave chip 106 having memory bank C portions 506 with corresponding read sense amplifier and write driver units 507 and memory bank D portions 508 with corresponding read sense amplifier and write driver units 509.

Further referring to FIG. 24, the master chip includes the serializer 266 and the deserializer 270 and the first gating units 328 and 330 all connected to a first node 510. The gating unit 328 controls the direction of signal transmission between first TSVs 512 and the first node 510, and the gating unit 330 controls the direction of signal transmission between second TSVs 514 and the first node 510.

Also referring to FIG. 24, second gating units 516 and 518 are connected between the TSVs 512 and 514 and bank interconnects 520 and 522, respectively. The bank interconnects 520 and 522 are connected to the memory banks A and B, respectively, fabricated in the master chip 102. The gating unit 516 controls the direction of signal transmission between the first TSVs 512 and the bank interconnect 520 for the memory bank A, and the gating unit 518 controls the direction of signal transmission between the second TSVs 514 and the bank interconnect 522 for the memory bank B.

Additionally referring to FIG. 24, third gating units 524 and 526 are connected between the TSVs 512 and 514 and bank interconnects 528 and 530, respectively. The bank interconnects 528 and 530 are connected to the memory banks C and D, respectively, fabricated in the slave chip 106. The gating unit 524 controls the direction of signal transmission between the first TSVs 512 and the bank interconnect 528 for the memory bank C, and the gating unit 526 controls the direction of signal transmission between the second TSVs 514 and the bank interconnect 530 for the memory bank D. The gating units 328, 330, 516, 518, 524, and 526 are controlled by the gating controller 327 of FIG. 38 according to the address ADDR and the command CMD for determining the direction of signal transmission.

Referring to FIGS. 12, 23, 24, and 25, when the three dimensional memory module 100 has a bidirectional external data bus with one memory rank and one bank group (row 471 in FIG. 23), the internal data buses in the master area 326 including the nodes 510 and the TSVs 512 and 514 are also bidirectional. Also in that case, the internal data buses in the slave area 332 including the bank interconnects 520, 522, 528, and 530 are also bidirectional.

Figure 26:
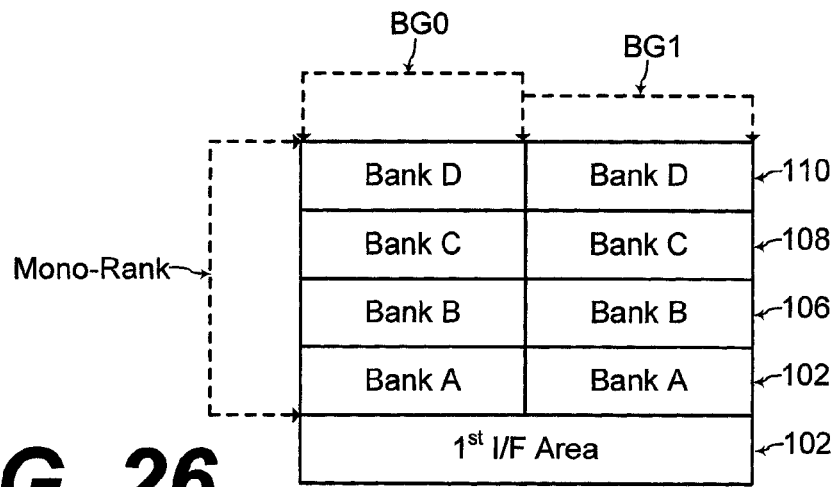
FIGS. 26 and 28 illustrate wirings formed through a master chip and a slave chip when one rank and multiple bank groups are formed in the three dimensional memory module of FIG. 1 with a bidirectional external data bus, according to an example embodiment of the present invention.
Figure 28:
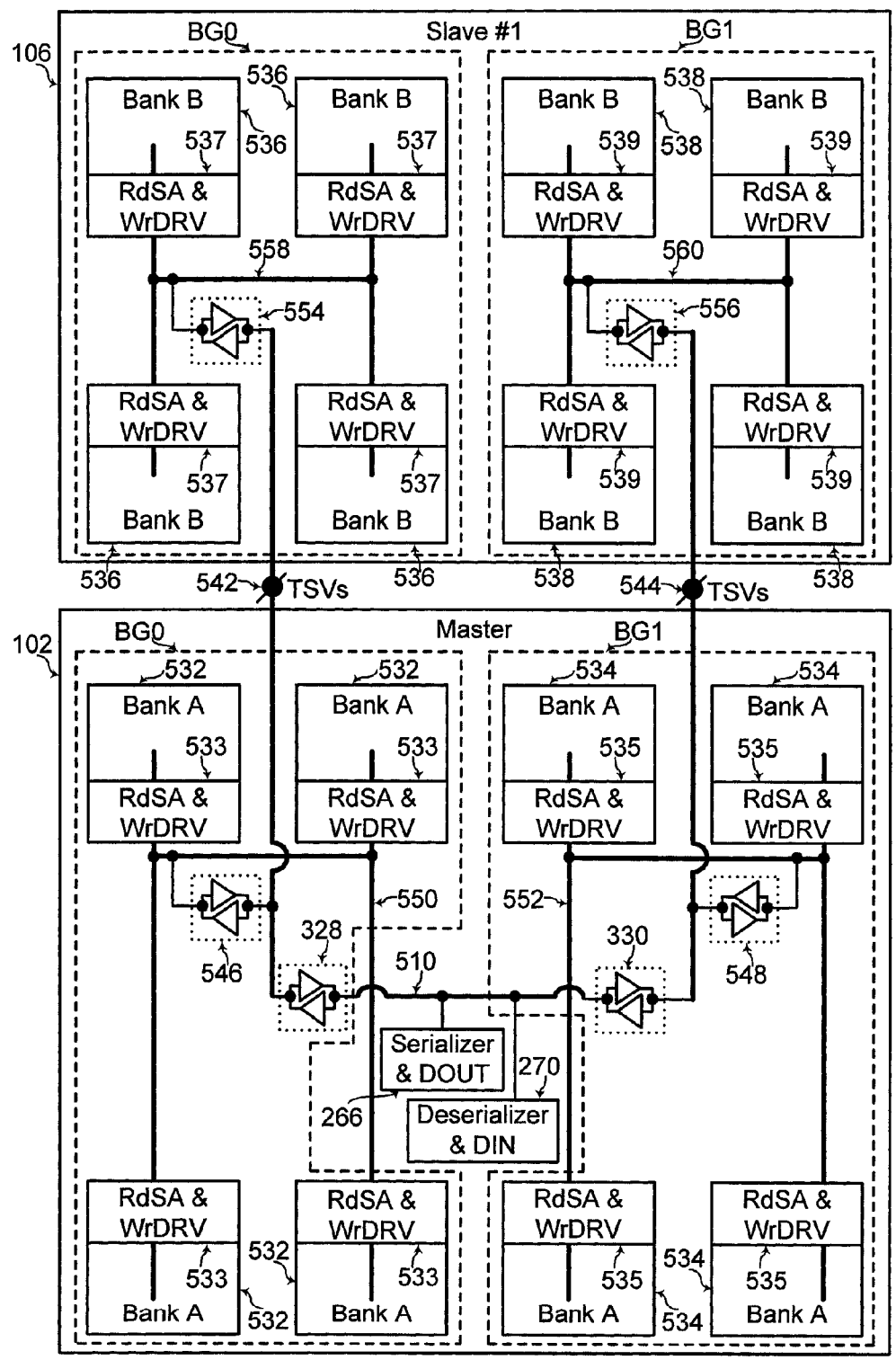

Row 472 in FIG. 23 is for the case of the three dimensional memory module 100 having a bidirectional external data bus along with one memory rank and multiple bank groups as illustrated in FIGS. 26 and 28, according to another embodiment of the present invention. Referring to FIG. 26, the first interface area between the memory controller 130 and the external I/O 132 is formed in the master chip 102. In addition in FIG. 26, memory bank A is formed entirely in the memory core 134 of the master chip 102, memory bank B is formed entirely in the memory core 136 of the slave chip 106, memory bank C is formed entirely in the memory core 138 of the slave chip 108, and memory bank D is formed entirely in the memory core 140 of the slave chip 110.

FIGS. 26 and 28 show a first bank group BG0 formed to extend vertically by including portions of the memory cores 134, 136, 138, and 140 in the stack of chips 102, 106, 108, and 110. In addition, FIGS. 26 and 28 show a second bank group BG1 formed to extend vertically by including the remaining portions of the memory cores 134, 136, 138, and 140 in the stack of chips 102, 106, 108, and 110.

Thus in FIG. 28, the master chip 102 includes first memory bank A portions 532 with corresponding read sense amplifier and write driver units 533 forming part of the first bank group BG0 (shown outlined in dashed lines in FIG. 28). The master chip 102 also includes second memory bank A portions 534 with corresponding read sense amplifier and write driver units 535 forming part of the second bank group BG1 (shown outlined in dashed lines in FIG. 28).

Also in FIG. 28, the slave chip 106 includes first memory bank B portions 536 with corresponding read sense amplifier and write driver units 537 forming part of the first bank group BG0 (shown outlined in dashed lines in FIG. 28). The slave chip 106 also includes second memory bank B portions 538 with corresponding read sense amplifier and write driver units 539 forming part of the second bank group BG1 (shown outlined in dashed lines in FIG. 28).

Further referring to FIG. 28, the master chip 102 includes the serializer 266, the deserializer 270, and the first gating units 328 and 330 all connected to the first node 510. The gating unit 328 controls the direction of signal transmission between first TSVs 542 and the first node 510, and the gating unit 330 controls the direction of signal transmission between second TSVs 544 and the first node 510.

Also referring to FIG. 28, second gating units 546 and 548 are connected between the TSVs 542 and 544 and bank A interconnects 550 and 552, respectively. The bank interconnect 550 is connected to the first memory bank A portions 532, and the bank interconnect 552 is connected to the second memory bank A portions 534, within the master chip 102. The gating unit 546 controls the direction of signal transmission between the first TSVs 542 and the bank interconnect 550, and the gating unit 548 controls the direction of signal transmission between the second TSVs 544 and the bank interconnect 552.

Additionally referring to FIG. 28, third gating units 554 and 556 are connected between the TSVs 542 and 544 and bank B interconnects 558 and 560, respectively. The bank interconnect 558 is connected to the first memory bank B portions 536, and the bank interconnect 560 is connected to the second memory bank B portions 538, within the slave chip 106. The gating unit 554 controls the direction of signal transmission between the first TSVs 542 and the bank interconnect 558, and the gating unit 556 controls the direction of signal transmission between the second TSVs 544 and the bank interconnect 560. The gating units 328, 330, 546, 548, 554, and 556 are controlled by the gating controller 327 of FIG. 38 according to the address ADDR and the command CMD for determining the direction of signal transmission.

Referring to FIGS. 12, 23, 26, and 28, when the three dimensional memory module 100 has a bidirectional external data bus with one memory rank and multiple bank groups B0 and B1 (row 472 in FIG. 23), the internal data buses in the master area 326 including the nodes 510 and the TSVs 542 and 544 are also bidirectional. Also in that case, the internal data buses in the slave area 332 including the bank interconnects 550, 552, 558, and 560 are also bidirectional.

Furthermore in that case (row 472 in FIG. 23), respective separate data buses are formed for each of the bank groups BG0 and BG1 to prevent data collision as explained above with reference to FIGS. 17 and 18. Thus in FIG. 28, a first set of data buses 542, 550, and 558 are formed for the first bank group BG0, and a second set of data buses 544, 552, and 560 are formed for the second bank group BG1, with the second set of data buses being electrically separated from the first set of data buses by the gating units 328 and 330.

Figure 27:
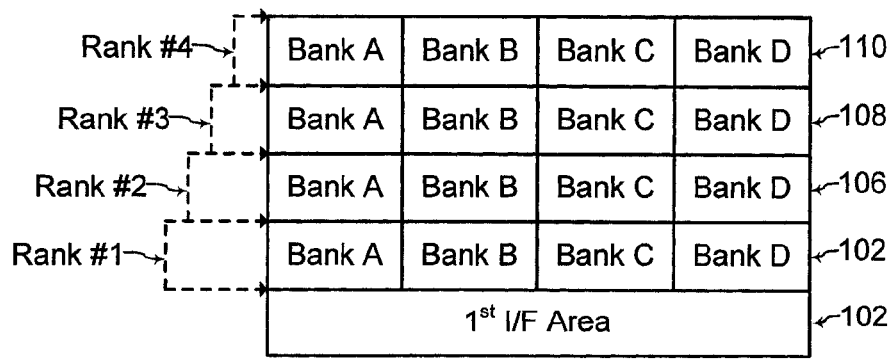
FIGS. 27 and 29 illustrate wirings formed through a master chip and a slave chip when multiple ranks and one bank group are formed in the three dimensional memory module of FIG. 1 with each rank being formed in a respective chip, according to an example embodiment of the present invention.
Figure 29:
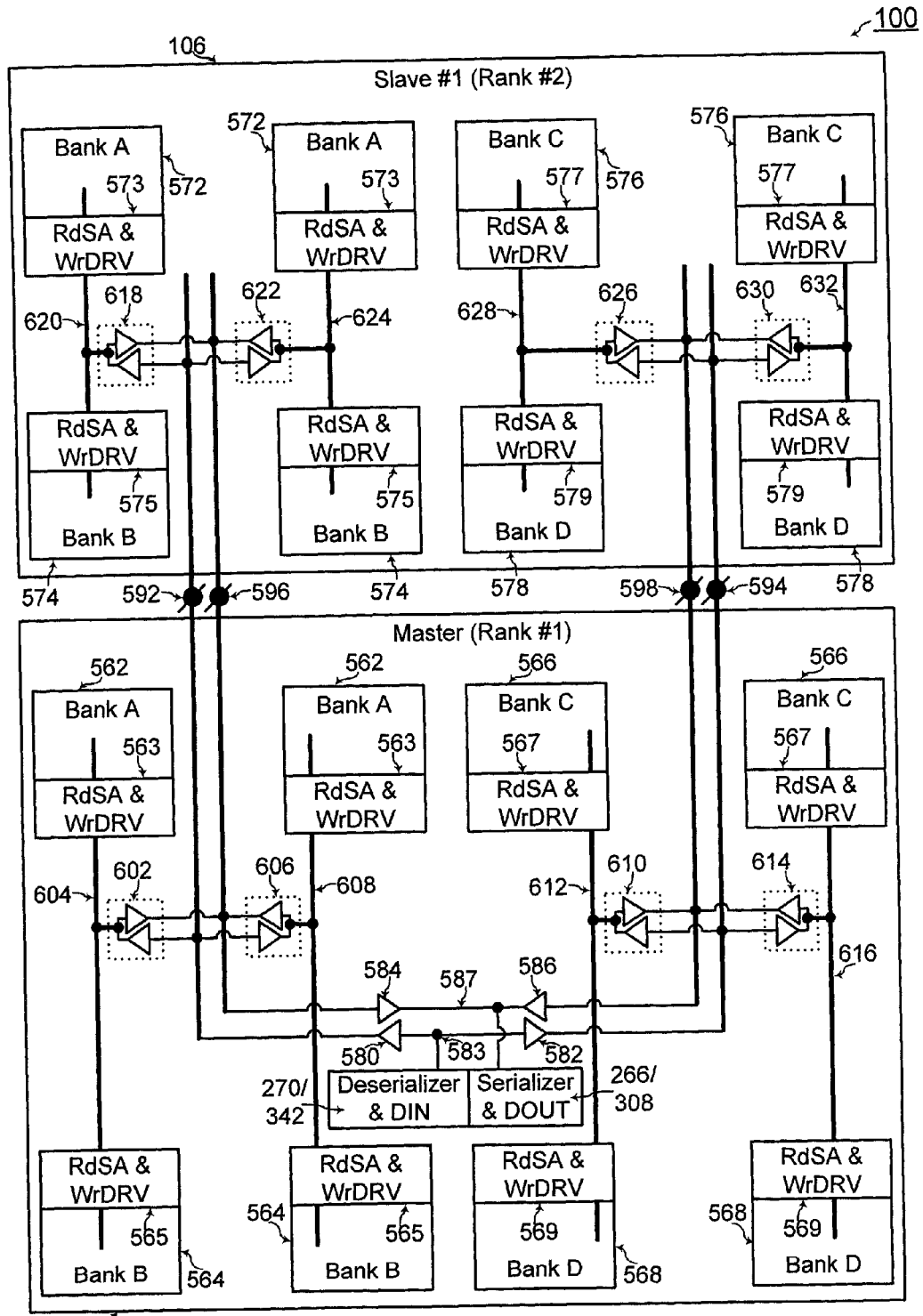

Row 473 in FIG. 23 is for the case of the three dimensional memory module 100 having a bidirectional external data bus along with multiple memory ranks and one bank group as illustrated in FIGS. 27 and 29, according to another embodiment of the present invention. Referring to FIG. 27, the first interface area between the memory controller 130 and the external I/O 132 is formed in the master chip 102. In addition in FIG. 27, respective memory bank A, B, C, and D portions forming a first rank (Rank #1) are formed entirely in the memory core 134 of the master chip 102.

Also in FIG. 27, respective memory bank A, B, C, and D portions forming a second rank (Rank #2) are formed entirely in the memory core 136 of the slave chip 106. Further in FIG. 27, respective memory bank A, B, C, and D portions forming a third rank (Rank #3) are formed entirely in the memory core 138 of the slave chip 108. Additionally in FIG. 27, respective memory bank A, B, C, and D portions forming a fourth rank (Rank #4) are formed entirely in the memory core 140 of the slave chip 110.

FIGS. 27 and 29 show a respective one of the first, second, third, and fourth ranks formed with each of the memory cores 134, 136, 138, and 140 of the master and slave chips 102, 106, 108, and 110. Thus in FIG. 29, the master chip 102 includes first memory bank A portions 562 with corresponding read sense amplifier and write driver units 563, first memory bank B portions 564 with corresponding read sense amplifier and write driver units 565, first memory bank C portions 566 with corresponding read sense amplifier and write driver units 567, and first memory bank D portions 568 with corresponding read sense amplifier and write driver units 569, for forming the first memory rank (Rank #1).

Further in FIG. 29, the slave chip 106 includes second memory bank A portions 572 with corresponding read sense amplifier and write driver units 573, second memory bank B portions 574 with corresponding read sense amplifier and write driver units 575, second memory bank C portions 576 with corresponding read sense amplifier and write driver units 577, and second memory bank D portions 578 with corresponding read sense amplifier and write driver units 579, for forming the second memory rank (Rank #2).

Also referring to FIG. 29, the master chip 102 includes the serializer 266, the deserializer 270, first gating units 580 and 582 coupled to the deserializer 270 at a first node 583, and second gating units 584 and 586 coupled to the serializer 266 at a second node 587. The first gating units 580 and 582 determine which one of first and second write TSVs 592 and 594 has write data from the deserializer 270 applied thereon. The second gating units 584 and 586 determine which one of first and second read TSVs 596 and 598 is connected to the serializer 266 that serializes respective read data on such a selected one of the read TSVs 596 and 598.

Further referring to FIG. 29, a third gating unit 602 controls coupling of one of the read TSVs 596 and the write TSVs 592 to a first bank interconnect 604 connected to the left bank portions 562 and 564. A fourth gating unit 606 controls coupling of one of the read TSVs 596 and the write TSVs 592 to a second bank interconnect 608 connected to the right bank portions 562 and 564. A fifth gating unit 610 controls coupling of one of the read TSVs 598 and the write TSVs 594 to a third bank interconnect 612 connected to the left bank portions 566 and 568. A sixth gating unit 614 controls coupling of one of the read TSVs 598 and the write TSVs 594 to a fourth bank interconnect 616 connected to the right bank portions 566 and 568.

Also referring to FIG. 29, a seventh gating unit 618 controls coupling of one of the read TSVs 596 and the write TSVs 592 to a fifth bank interconnect 620 connected to the left bank portions 572 and 574. An eighth gating unit 622 controls coupling of one of the read TSVs 596 and the write TSVs 592 to a sixth bank interconnect 624 connected to the right bank portions 572 and 574. A ninth gating unit 626 controls coupling of one of the read TSVs 598 and the write TSVs 594 to a seventh bank interconnect 628 connected to the left bank portions 576 and 578. A tenth gating unit 630 controls coupling of one of the read TSVs 598 and the write TSVs 594 to an eighth bank interconnect 632 connected to the right bank portions 576 and 578.

The gating units 580, 582, 584, 586, 602, 606, 610, and 614 are formed in the master chip 102. The gating units 618, 622, 626, and 630 are formed in the slave chip 106. The gating units 580, 582, 584, 586, 602, 606, 610, 614, 618, 622, 626, and 630 are controlled by the gating controller 327 of FIG. 38 according to the address ADDR and the command CMD for determining the direction of signal transmission.

Referring to FIGS. 12, 23, 27, and 29, when the three dimensional memory module 100 has a bidirectional external data bus with multiple memory ranks and one bank group (row 473 in FIG. 23), the internal data buses in the master area 326 including the nodes 583 and 587 and the TSVs 592, 594, 596, and 598 are each unidirectional being dedicated to transmit a respective one of read data or write data. Accordingly in that case (row 473 in FIG. 23), respective separate unidirectional data buses are formed for the read data and the write data for preventing data collision during rank to rank interleaving as explained above with reference to FIGS. 14, 15, and 16.

Also in that case, the internal data buses in the slave area 332 including the bank interconnects 604, 608, 612, 616, 620, 624, 628, and 632 are each bidirectional transmitting both read data and write data at different times. The bidirectional bank interconnects 604, 608, 612, 616, 620, 624, 628, and 632 are capable of transmitting both read data and write data but transmit one of read data or write data at any given time depending on which respective one of read TSVs or write TSVs is connected thereto.

Figure 30:
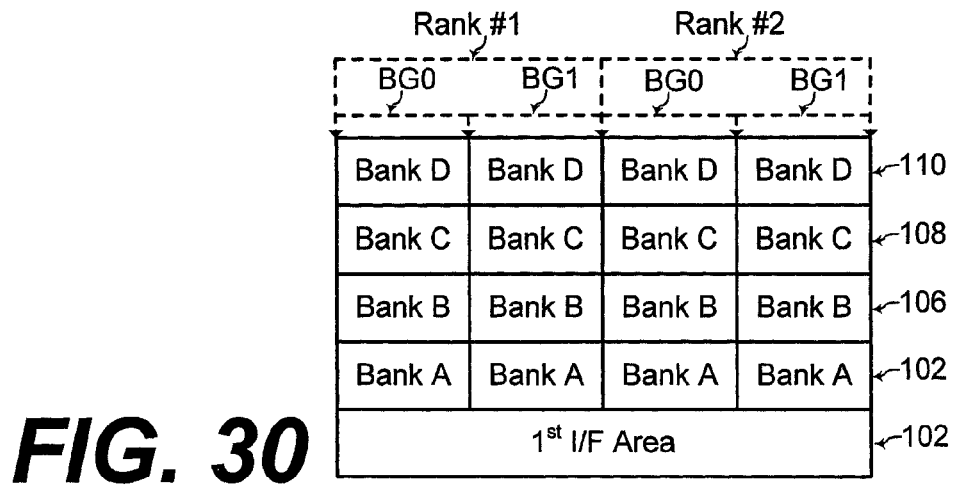
FIGS. 30 and 33 illustrate wirings formed through a master chip and a slave chip when multiple ranks and multiple bank groups are formed in the three dimensional memory module of FIG. 1 for a bidirectional external data bus or unidirectional external data buses, according to an example embodiment of the present invention.
Figure 33:
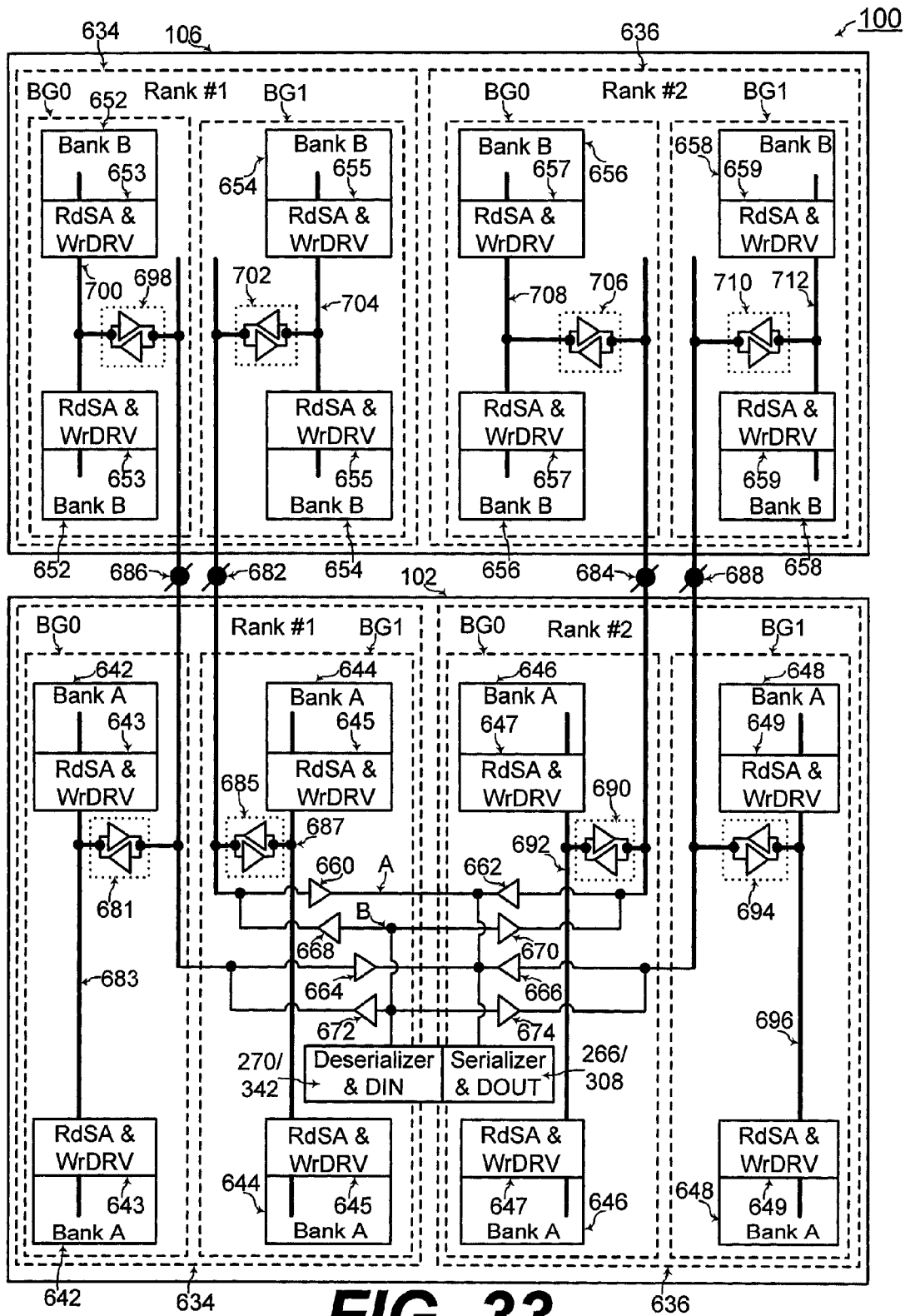

Row 474 in FIG. 23 is for the case of the three dimensional memory module 100 having a bidirectional external data bus along with multiple memory ranks and multiple bank groups as illustrated in FIGS. 30 and 33, according to another embodiment of the present invention. Referring to FIG. 30, the first interface area between the memory controller 130 and the external I/O 132 is formed in the master chip 102. In addition in FIG. 30, memory bank A is formed entirely in the memory core 134 of the master chip 102, memory bank B is formed entirely in the memory core 136 of the slave chip 106, memory bank C is formed entirely in the memory core 138 of the slave chip 108, and memory bank D is formed entirely in the memory core 140 of the slave chip 110.

FIGS. 30 and 33 show a first bank group BG0 formed to extend vertically by including portions of the memory cores 134, 136, 138, and 140 in the stack of chips 102, 106, 108, and 110. In addition, FIGS. 30 and 33 show a second bank group BG1 formed to extend vertically by including the remaining portions of the memory cores 134, 136, 138, and 140 in the stack of chips 102, 106, 108, and 110.

Further in FIGS. 30 and 33, a first rank (Rank #1) 634 comprised of portions of the first and second bank groups BG0 and BG1 is formed to extend vertically by including portions of the memory cores 134, 136, 138, and 140 in the stack of chips 102, 106, 108, and 110. Also in FIGS. 30 and 33, a second rank (Rank #2) 636 comprised of remaining portions of the first and second bank groups BG0 and BG1 is formed to extend vertically by including remaining portions of the memory cores 134, 136, 138, and 140 in the stack of chips 102, 106, 108, and 110.

Thus in FIG. 33, the master chip 102 includes first memory bank A portions 642 with corresponding read sense amplifier and write driver units 643 forming part of the first bank group BG0 in the first rank 634 (shown outlined in dashed lines in FIG. 28). The master chip 102 also includes second memory bank A portions 644 with corresponding read sense amplifier and write driver units 645 forming part of the second bank group BG1 in the first rank 634 (shown outlined in dashed lines in FIG. 28).

Additionally in FIG. 33, the master chip 102 includes third memory bank A portions 646 with corresponding read sense amplifier and write driver units 647 forming part of the first bank group BG0 in the second rank 636 (shown outlined in dashed lines in FIG. 28). The master chip 102 also includes fourth memory bank A portions 648 with corresponding read sense amplifier and write driver units 649 forming part of the second bank group BG1 in the second rank 636 (shown outlined in dashed lines in FIG. 28).

Further in FIG. 33, the slave chip 106 includes first memory bank B portions 652 with corresponding read sense amplifier and write driver units 653 forming part of the first bank group BG0 in the first rank 634 (shown outlined in dashed lines in FIG. 28). The slave chip 106 also includes second memory bank B portions 654 with corresponding read sense amplifier and write driver units 655 forming part of the second bank group BG1 in the first rank 634 (shown outlined in dashed lines in FIG. 28).

Additionally in FIG. 33, the slave chip 106 includes third memory bank B portions 656 with corresponding read sense amplifier and write driver units 657 forming part of the first bank group BG0 in the second rank 636 (shown outlined in dashed lines in FIG. 28). The slave chip 102 also includes fourth memory bank B portions 658 with corresponding read sense amplifier and write driver units 659 forming part of the second bank group BG1 in the second rank 636 (shown outlined in dashed lines in FIG. 28).

Also referring to FIG. 33, the master chip 102 includes the serializer 266, the deserializer 270, first gating units 660 and 662 coupled to the serializer 266 at a first node A, and second gating units 664 and 666 coupled to the serializer 266 at the first node A. The master chip 102 further includes third gating units 668 and 670 coupled to the deserializer 270 at a second node B, and fourth gating units 672 and 674 coupled to the deserializer 270 at the second node B.

The first gating units 660 and 662 determine which one of first and second TSVs 682 and 684 is connected to the serializer 266 that serializes respective read data on such a selected one of the TSVs 682 and 684 when transmitting read data. The second gating units 664 and 666 determine which one of third and fourth TSVs 686 and 688 is connected to the serializer 266 that serializes respective read data on such a selected one of the TSVs 686 and 688 when transmitting read data.

The third gating units 668 and 670 determine which one of the first and second TSVs 682 and 684 has write data from the deserializer 270 applied thereon when transmitting write data. The fourth gating units 672 and 674 determine which one of the third and fourth TSVs 686 and 688 has write data from the deserializer 270 applied thereon when transmitting write data.

Also referring to FIG. 33, a fifth gating unit 681 is connected between the TSVs 686 and a first bank interconnect 683 connected to the memory bank A portions 642 in the first bank group BG0 of the first rank (Rank #1) within the master chip 102. A sixth gating unit 685 is connected between the TSVs 682 and a second bank interconnect 687 connected to the memory bank A portions 644 in the second bank group BG1 of the first rank (Rank #1) within the master chip 102.

Further referring to FIG. 33, a seventh gating unit 690 is connected between the TSVs 684 and a third bank interconnect 692 connected to the memory bank A portions 646 in the first bank group BG0 of the second rank (Rank #2) within the master chip 102. An eighth gating unit 694 is connected between the TSVs 688 and a fourth bank interconnect 696 connected to the memory bank A portions 648 in the second bank group BG1 of the second rank (Rank #2) within the master chip 102.

Also referring to FIG. 33, a ninth gating unit 698 is connected between the TSVs 686 and a fifth bank interconnect 700 connected to the memory bank B portions 652 in the first bank group BG0 of the first rank (Rank #1) within the slave chip 106. A tenth gating unit 702 is connected between the TSVs 682 and a sixth bank interconnect 704 connected to the memory bank B portions 654 in the second bank group BG1 of the first rank (Rank #1) within the slave chip 106.

Further referring to FIG. 33, an eleventh gating unit 706 is connected between the TSVs 684 and a seventh bank interconnect 708 connected to the memory bank B portions 656 in the first bank group BG0 of the second rank (Rank #2) within the slave chip 106. A twelfth gating unit 710 is connected between the TSVs 688 and an eighth bank interconnect 712 connected to the memory bank B portions 658 in the second bank group BG1 of the second rank (Rank #2) within the slave chip 106.

The gating unit 681 controls the direction of signal transmission between the TSVs 686 and the first bank interconnect 683, and the gating unit 685 controls the direction of signal transmission between the TSVs 682 and the second bank interconnect 687, within the master chip 102. The gating unit 690 controls the direction of signal transmission between the TSVs 684 and the third bank interconnect 692, and the gating unit 694 controls the direction of signal transmission between the TSVs 688 and the fourth bank interconnect 696, within the master chip 102.

The gating unit 698 controls the direction of signal transmission between the TSVs 686 and the fifth bank interconnect 700, and the gating unit 702 controls the direction of signal transmission between the TSVs 682 and the sixth bank interconnect 704, within the slave chip 106. The gating unit 706 controls the direction of signal transmission between the TSVs 684 and the seventh bank interconnect 708, and the gating unit 710 controls the direction of signal transmission between the TSVs 688 and the eighth bank interconnect 712, within the slave chip 106.

The gating units 660, 662, 664, 666, 668, 670, 672, 674, 681, 685, 690, and 694 are formed in the master chip 102, and the gating units 698, 702, 706, and 710 are formed in the slave chip 106. The gating units 660, 662, 664, 666, 668, 670, 672, 674, 681, 685, 690, 694, 698, 702, 706, and 710 are controlled by the gating controller 327 of FIG. 38 according to the address ADDR and the command CMD for determining the direction of signal transmission.

With the three dimensional memory module 100 of FIG. 33 having multiple ranks (row 474 in FIG. 23), unidirectional read and write data buses are formed with the nodes A and B in the master area 326. In addition in that case, the TSVs 682, 684, 686, and 688 are used as unidirectional read and write data buses during rank to rank interleaving among the multiple ranks of the three dimensional memory module 100 of FIG. 33. Such use of the TSVs 682, 684, 686, and 688 prevents data collision during rank to rank interleaving as explained above with respect to FIGS. 14, 15, and 16.

Alternatively with the three dimensional memory module 100 of FIG. 33 also having multiple bank groups (row 474 in FIG. 23), the TSVs 682, 684, 686, and 688 form bidirectional read and write data buses during bank group to bank group interleaving among the multiple bank groups BG0 and BG1 of the three dimensional memory module 100 of FIG. 33. Thus, separate sets of bidirectional read and write data buses are formed by the TSVs 682, 684, 686, and 688 for the multiple bank groups BG0 and BG1 to prevent data collision during bank group to bank group interleaving as explained above with respect to FIGS. 17 and 18. Also in that case (row 474 in FIG. 23) of FIG. 33, the internal data buses in the slave area 332 including the bank interconnects 683, 687, 692, 696, 700, 704, 708, and 712 for connection to the memory bank portions are bidirectional.

Figure 34:
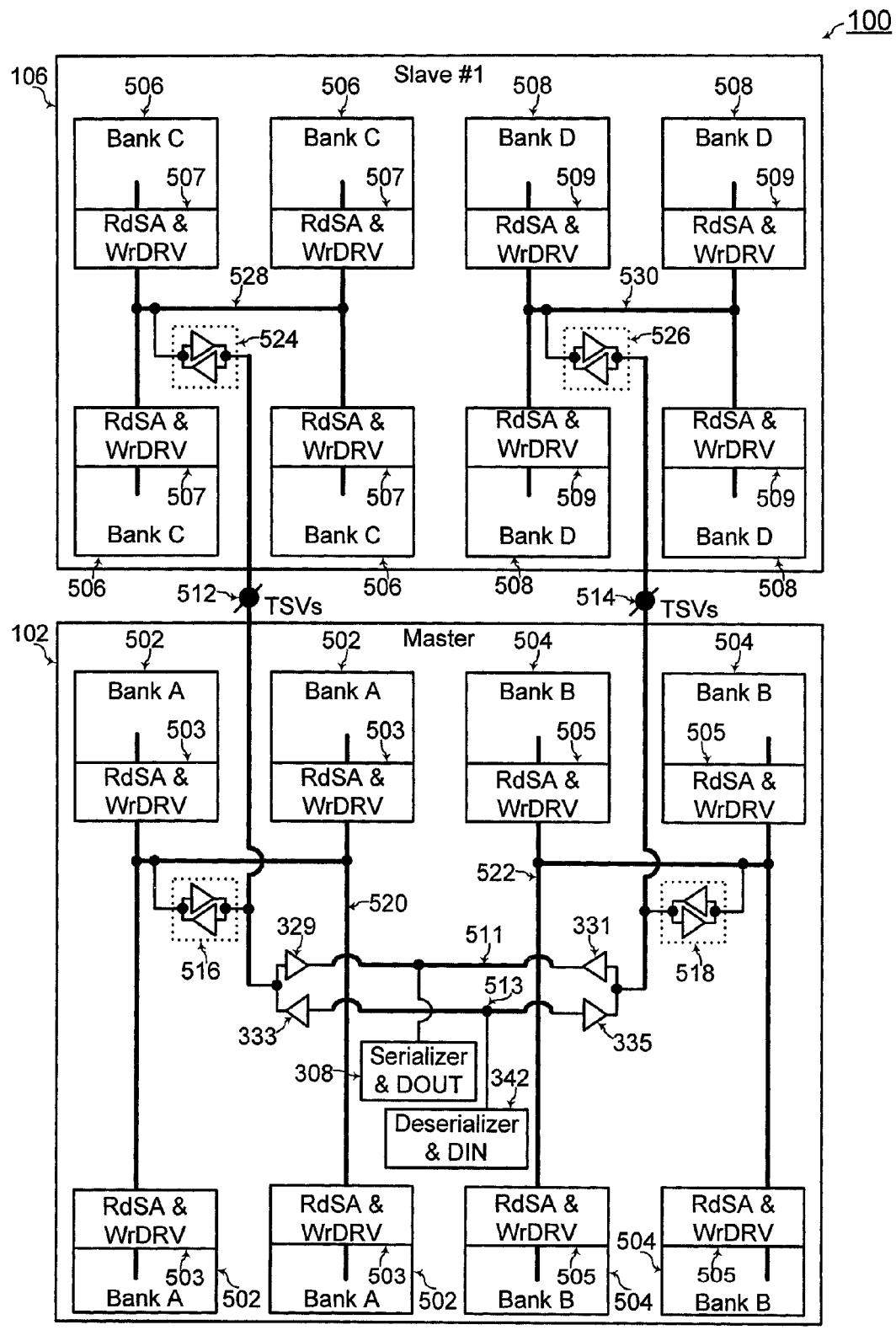

Row 475 in FIG. 23 is for the case of the three dimensional memory module 100 having one memory rank and one bank group with unidirectional external data buses as illustrated in FIGS. 25 and 34. Elements having the same reference number in FIGS. 24 and 34 refer to elements having similar structure and/or function. FIGS. 24 and 34 are both for the three dimensional memory module 100 having one memory rank and one bank group. However, FIG. 24 is for the three dimensional memory module 100 having a bidirectional external data bus (row 471 in FIG. 23), and FIG. 34 is for the three dimensional memory module 100 having unidirectional external data buses (row 475 in FIG. 23).

Referring to FIG. 34, the master chip 102 includes the serializer 308, the deserializer 342, first gating units 329 and 331 coupled to the serializer 308 at a first node 511, and second gating units 333 and 335 coupled to the deserializer 342 at a second node 513. The first gating units 329 and 331 determine which one of TSVs 512 and 514 is connected to the serializer 308 that serializes respective read data on such a selected one of the TSVs 512 and 514. The second gating units 333 and 335 determine which of the TSVs 512 and 514 has write data from the deserializer 342 applied thereon.

Referring to FIGS. 13, 23, 25, and 34, when the three dimensional memory module 100 has unidirectional external data buses with one memory rank and one bank group (row 475 in FIG. 23), the internal data buses in the master area 326 including the nodes 511 and 513 are unidirectional data buses with each unidirectional bus being dedicated to transmit a respective one of read data or write data. Also in that case, the internal data buses in the slave area 332 including the bank interconnects 520, 522, 528, and 530 and the TSVs 512 and 514 are bidirectional, each transmitting read data and write data at different times.

Figure 35:
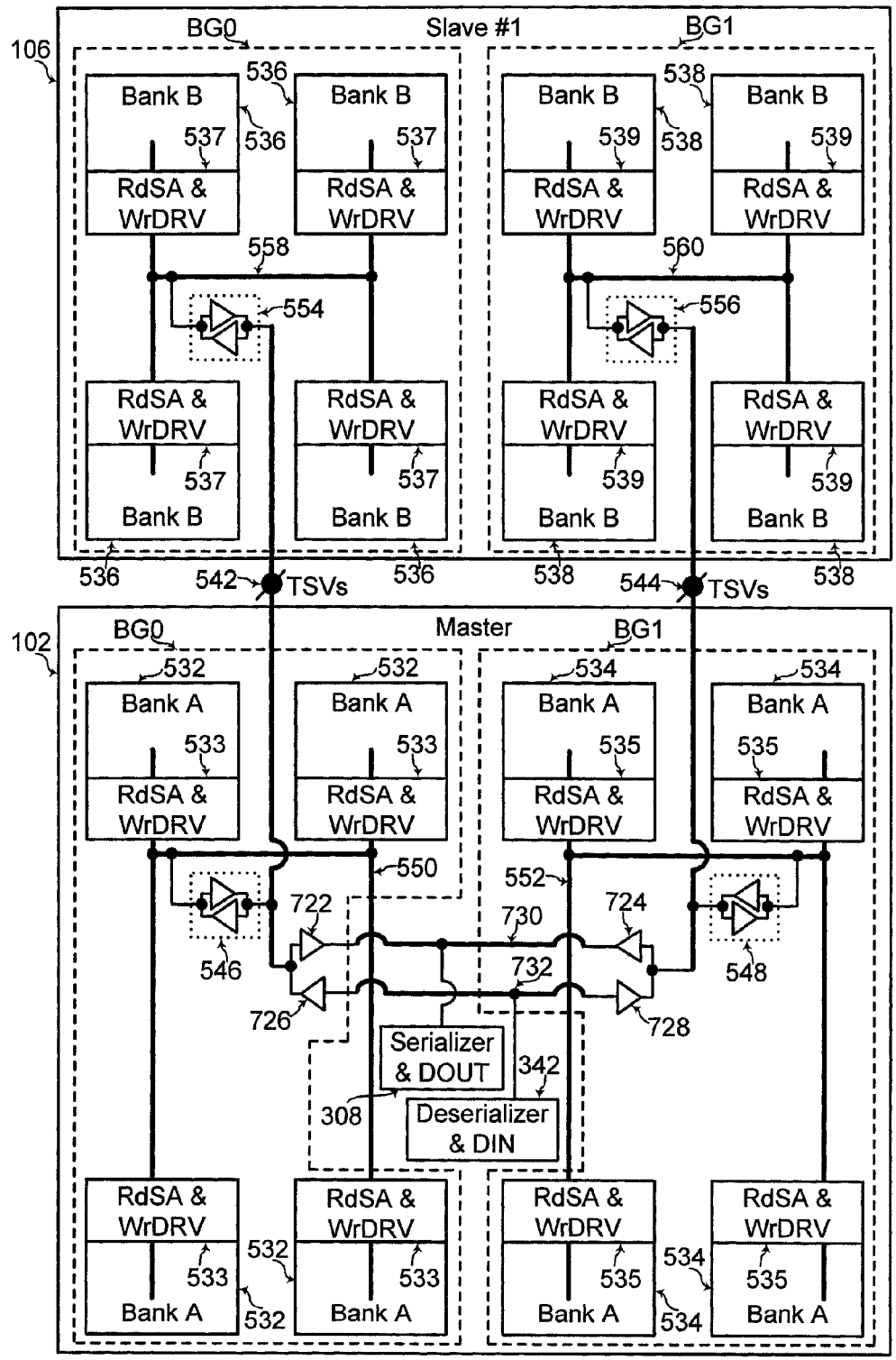

Row 476 in FIG. 23 is for the case of the three dimensional memory module 100 having one memory rank and multiple bank groups with unidirectional external data buses as illustrated in FIGS. 26 and 35. Elements having the same reference number in FIGS. 28 and 35 refer to elements having similar structure and/or function. FIGS. 28 and 35 are both for the three dimensional memory module 100 having one memory rank and multiple bank groups, as illustrated in FIG. 26. However, FIG. 28 is for the three dimensional memory module 100 having a bidirectional external data bus (row 472 in FIG. 23), and FIG. 35 is for the three dimensional memory module 100 having unidirectional external data buses (row 476 in FIG. 23).

Referring to FIG. 35, the master chip 102 includes the serializer 308, the deserializer 342, first gating units 722 and 724 coupled to the serializer 308 at a first node 730, and second gating units 726 and 728 coupled to the deserializer 342 at a second node 732. The first gating units 722 and 724 determine which one of TSVs 542 and 544 is connected to the serializer 308 that serializes respective read data on such a selected one of the TSVs 542 and 544. The second gating units 726 and 728 determine which of the TSVs 542 and 544 has write data from the deserializer 342 applied thereon.

Referring to FIGS. 13, 23, 26, and 35, when the three dimensional memory module 100 has unidirectional external data buses with one memory rank and multiple bank groups (row 476 in FIG. 23), the internal data buses in the master area 326 including the nodes 730 and 732 are unidirectional buses with each unidirectional bus being dedicated to transmit a respective one of read data or write data. Also in that case, the internal data buses in the slave area 332 including the bank interconnects 550, 552, 558, and 560 and the TSVs 542 and 544 are bidirectional, each transmitting read data and write data at different times. Further in that case, separate TSVs 542 and 544 are formed as separate data buses for each of the bank groups BG0 and BG1 to prevent data collision during bank group to bank group interleaving as explained above with respect to FIGS. 17 and 18.

Row 477 in FIG. 23 is for the case of the three dimensional memory module 100 having multiple memory ranks and one bank group with unidirectional external data buses as illustrated in FIGS. 27 and 29. Another words, FIGS. 27 and 29 illustrate internal data buses within the master chip 102 and the example slave chip 106 for both cases of the three dimensional memory module 100 having a bidirectional external data bus or unidirectional external data buses (rows 473 and 477 in FIG. 23).

Figure 36:
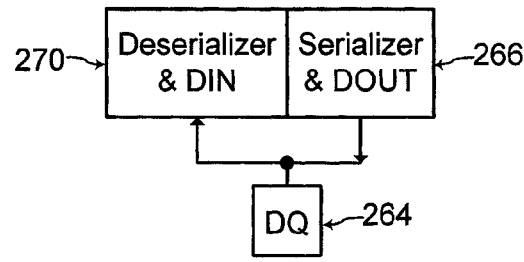
FIG. 36 illustrates connection between an external data pad for a bidirectional external data bus and components in a master chip in the three dimensional memory module of FIG. 1, according to an example embodiment of the present invention.
Figure 37:
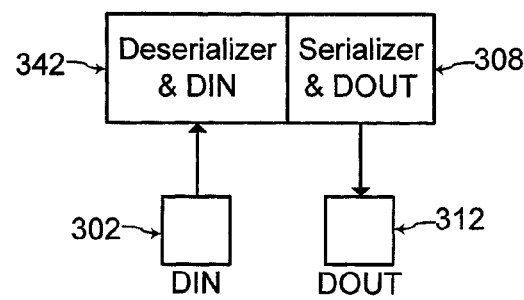
FIG. 37 illustrates connection between external data pads for unidirectional external data buses and components in a master chip in the three dimensional memory module of FIG. 1, according to an example embodiment of the present invention.

For the case of the three dimensional memory module 100 having the bidirectional external data bus 264 of FIGS. 12 and 36, the deserializer 270 and serializer 266 are both coupled to the bidirectional external data bus 264 in FIG. 29. For the case of the three dimensional memory module 100 having the unidirectional external data buses 302 and 312 of FIGS. 13 and 37, the deserializer 342 and the serializer 308 are respectively coupled to the unidirectional external data buses 302 and 312 in FIG. 29.

For the case of the three dimensional memory module 100 having multiple memory ranks and one bank group with the unidirectional external data buses (row 477 of FIG. 23), the internal data buses in the master area 326 including the nodes 583 and 587 and the TSVs 592, 594, 596, and 598 are each unidirectional being dedicated to transmit a respective one of read data or write data. Accordingly in that case (row 477 in FIG. 23), respective separate unidirectional data buses are formed for the read data and the write data for preventing data collision during rank to rank interleaving as explained above with reference to FIGS. 14, 15, and 16.

Also in that case (row 477 in FIG. 23), the internal data buses in the slave area 332 including the bank interconnects 604, 608, 612, 616, 620, 624, 628, and 632 are each bidirectional transmitting both read data and write data. The bidirectional bank interconnects 604, 608, 612, 616, 620, 624, 628, and 632 transmit both read data and write data at different times depending on which respective one of read TSVs or write TSVs is connected to each of such bidirectional bank interconnects.

Row 478 in FIG. 23 is for the case of the three dimensional memory module 100 having multiple memory ranks and multiple bank groups with unidirectional external data buses as illustrated in FIGS. 30 and 33. Another words, FIGS. 30 and 33 illustrate internal data buses within the master chip 102 and the example slave chip 106 for both cases of the three dimensional memory module 100 having a bidirectional external data bus or unidirectional external data buses.

For the case of the three dimensional memory module 100 having the bidirectional external data bus 264 of FIGS. 12 and 36, the deserializer 270 and serializer 266 are both coupled to the bidirectional external data bus 264 in FIG. 33. For the case of the three dimensional memory module 100 having the unidirectional external data buses 302 and 312 of FIGS. 13 and 37, the deserializer 342 and the serializer 308 are respectively coupled to the unidirectional external data buses 302 and 312 in FIG. 33.

With the three dimensional memory module 100 of FIG. 33 having multiple ranks (row 478 in FIG. 23), unidirectional read and write data buses are formed with the nodes A and B in the master area 326. In addition in that case, the TSVs 682, 684, 686, and 688 are used as unidirectional read and write data buses during rank to rank interleaving among the multiple ranks of the three dimensional memory module 100 of FIG. 33. Such use of the TSVs 682, 684, 686, and 688 prevents data collision during rank to rank interleaving as explained above with respect to FIGS. 14, 15, and 16.

Alternatively with the three dimensional memory module 100 of FIG. 33 also having multiple bank groups (row 478 in FIG. 23), the TSVs 682, 684, 686, and 688 are used as bidirectional read and write data buses during bank group to bank group interleaving among the multiple bank groups BG0 and BG1 of the three dimensional memory module 100 of FIG. 33. Thus, separate sets of bidirectional read and write data buses are formed by the TSVs 682, 684, 686, and 688 for the multiple bank groups BG0 and BG1 to prevent data collision during bank group to bank group interleaving as explained above with respect to FIGS. 17 and 18. Also in that case (row 478 in FIG. 23) of FIG. 33, the internal data buses in the slave area 332 including the bank interconnects 683, 687, 692, 696, 700, 704, 708, and 712 for connection to the memory bank portions are bidirectional.

In summary referring to all rows 471, 472, 473, 474, 475, 476, 477, and 478 in FIG. 23, the internal data buses in the slave area 332 are bidirectional for minimizing the number of interconnect structures for connection to the memory cores of the master and slave chips 102, 106, 108, and 110. In addition, the internal data buses in the master area 326 include unidirectional read and write data buses when the three dimensional memory module 100 has unidirectional external data buses, and when the three dimensional memory module 100 has multiple ranks for preventing data collision during rank to rank interleaving as explained above with respect to FIGS. 14, 15, and 16. Otherwise, the internal data buses in the master area 326 are bidirectional data buses for minimizing the number of interconnect structures therein.

Also in FIG. 23, the master area 326 has a separate set of data buses for each bank group when the three dimensional memory module 100 has multiple bank groups for preventing data collision during bank group to bank group interleaving as explained above with respect to FIGS. 17 and 18. Example configurations of the internal data buses in the master area 326 and the slave area 332 as illustrated in FIGS. 24, 28, 29, 33, 34, and 35 are by way of example only. In addition, FIGS. 24, 28, 29, 33, 34, and 35 illustrate example capacity organizations of the memory cores 134, 136, 138, and 140 in the master and slave chips 102, 106, 108, and 110 including at least one memory bank, at least one bank group, and at least one rank. Such examples of FIGS. 24, 28, 29, 33, 34, and 35 illustrate efficient configuration of the internal data buses in the master area 326 and the slave area 332 and capacity organization for preventing data collision and minimizing number of interconnect structures.

Figure 31:
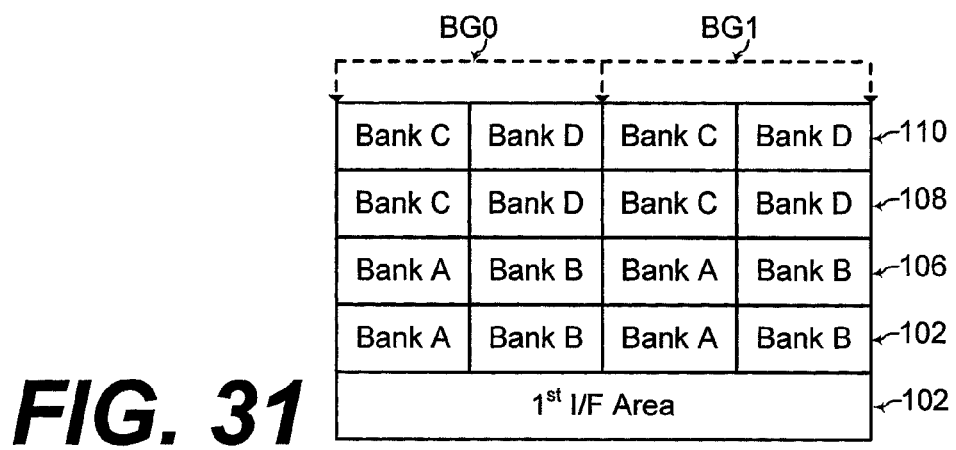
FIGS. 31 and 39 illustrate wirings formed through a master chip and a slave chip when one rank and multiple bank groups are formed, with a memory bank extending through multiple chips in the three dimensional memory module of FIG. 1, according to an example embodiment of the present invention.
Figure 39:
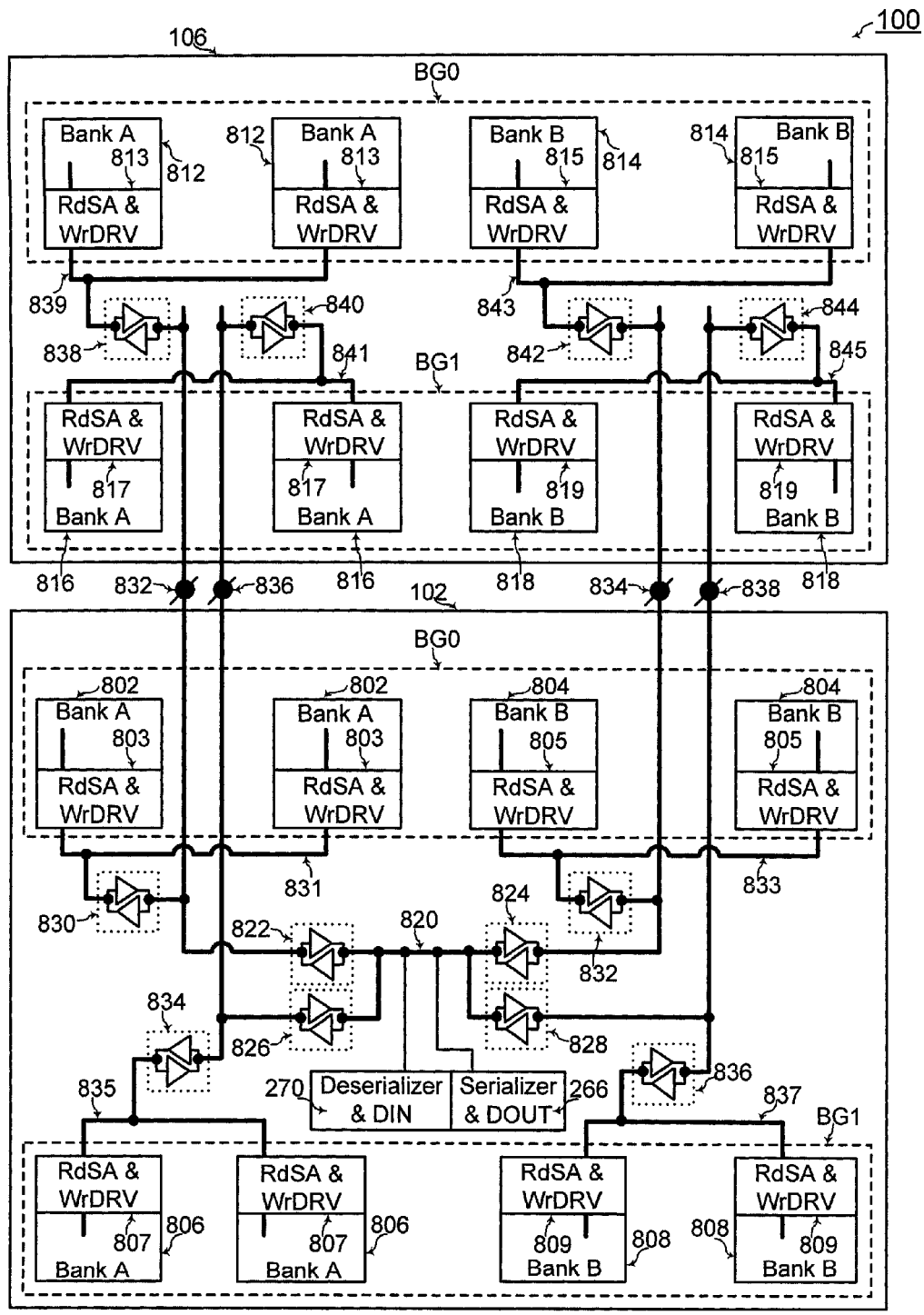

For example, FIGS. 31 and 39 illustrate less efficient capacity organization compared to FIGS. 26 and 28 for when the three dimensional memory module 100 has one rank and multiple bank groups. Each of the chips 102, 106, 108, and 110 in FIGS. 26 and 28 has a respective one of banks A, B, C, and D formed entirely therein. In contrast, each of the chips 102, 106, 108, and 110 in FIGS. 31 and 39 has a respective set of multiple banks A, B, C, and D formed therein. Thus in FIG. 31, the master chip 102 and the slave chip 106 both include bank A and bank B portions, and the slave chips 108 and 110 both include bank C and bank D portions.

Referring to FIG. 39, the master chip 102 includes first memory bank A portions 802 with corresponding read sense amplifier and write driver units 803 and first memory bank B portions 804 with corresponding read sense amplifier and write driver units 805, forming part of the first bank group BG0 (shown outlined in dashed lines in FIG. 39). The master chip 102 also includes second memory bank A portions 806 with corresponding read sense amplifier and write driver units 807 and second memory bank B portions 808 with corresponding read sense amplifier and write driver units 809, forming part of the second bank group BG1 (shown outlined in dashed lines in FIG. 39).

Further referring to FIG. 39, the slave chip 106 includes third memory bank A portions 812 with corresponding read sense amplifier and write driver units 813 and third memory bank B portions 814 with corresponding read sense amplifier and write driver units 815, forming part of the first bank group BG0 (shown outlined in dashed lines in FIG. 39). The slave chip 106 also includes fourth memory bank A portions 816 with corresponding read sense amplifier and write driver units 817 and fourth memory bank B portions 818 with corresponding read sense amplifier and write driver units 819, forming part of the second bank group BG1 (shown outlined in dashed lines in FIG. 39).

Further referring to FIG. 39, the master chip 102 includes the serializer 266, the deserializer 270, a first gating unit 822, a second gating unit 824, a third gating unit 826, and a fourth gating unit 828 all connected to a first node 820. The first gating unit 822 controls the direction of signal transmission between the first node 820 and first TSVs 832. The second gating unit 824 controls the direction of signal transmission between the first node 820 and second TSVs 834. The third gating unit 826 controls the direction of signal transmission between the first node 820 and third TSVs 836. The fourth gating unit 828 controls the direction of signal transmission between the first node 820 and fourth TSVs 838.

The master chip 102 of FIG. 39 also includes a fifth gating unit 830 for controlling the direction of signal transmission between the first TSVs 832 and a first bank interconnect 831 connected to the first bank A portions 802. Furthermore, a sixth gating unit 832 controls the direction of signal transmission between the second TSVs 834 and a second bank interconnect 833 connected to the first bank B portions 804.

Also, a seventh gating unit 834 controls the direction of signal transmission between the third TSVs 836 and a third bank interconnect 835 connected to the second bank A portions 806. An eighth gating unit 836 controls the direction of signal transmission between the second TSVs 838 and a fourth bank interconnect 837 connected to the second bank B portions 808.

The slave chip 106 of FIG. 39 also includes a ninth gating unit 838 for controlling the direction of signal transmission between the first TSVs 832 and a fifth bank interconnect 839 connected to the third bank A portions 812. Furthermore, a tenth gating unit 840 controls the direction of signal transmission between the third TSVs 836 and a sixth bank interconnect 841 connected to the fourth bank A portions 816.

Furthermore in the slave chip 106 of FIG. 39, an eleventh gating unit 842 controls the direction of signal transmission between the second TSVs 834 and a seventh bank interconnect 843 connected to the third bank B portions 814. A twelfth gating unit 844 controls the direction of signal transmission between the fourth TSVs 838 and an eighth bank interconnect 845 connected to the fourth bank B portions 818.

In FIG. 39, multiple TSVs 832 and 836 are formed for bank A portions forming the multiple bank groups BG0 and BG1 formed in the chips 102 and 106. Also, multiple TSVs 834 and 838 are formed for bank B portions forming the multiple bank groups BG0 and BG1 formed in the chips 102 and 106. Such separate TSVs are formed in FIG. 39 for bank group to bank group interleaving.

However comparing FIGS. 28 and 39, the capacity organization of FIG. 39 results in more TSVs 832, 834, 836, and 838 in FIG. 39 than the TSVs 542 and 544 in FIG. 28. Additionally, the capacity organization of FIG. 39 results in more gating units 822, 824, 826, 828, 830, 832, 834, 836, 838, 840, 842, and 844 than the gating units 328, 330, 546, 548, 554, and 556 in FIG. 28. Thus, the capacity organization of FIG. 28 is more efficient than the capacity organization of FIG. 39 for forming the multiple bank groups BG0 and BG1.

Figure 32:
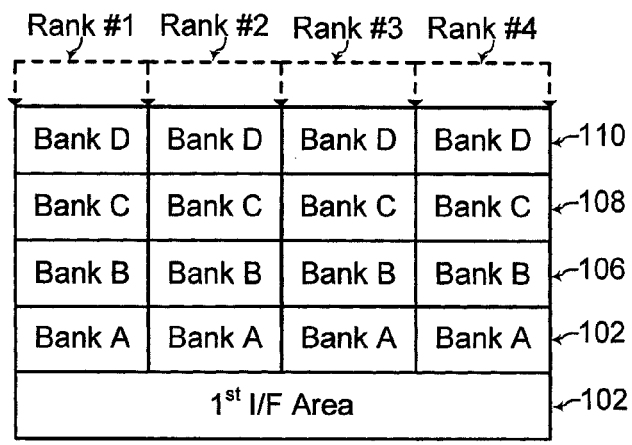
FIGS. 32 and 40 illustrate wirings formed through a master chip and a slave chip when multiple ranks and one bank group are formed in the three dimensional memory module of FIG. 1, according to an example embodiment of the present invention.
Figure 40:
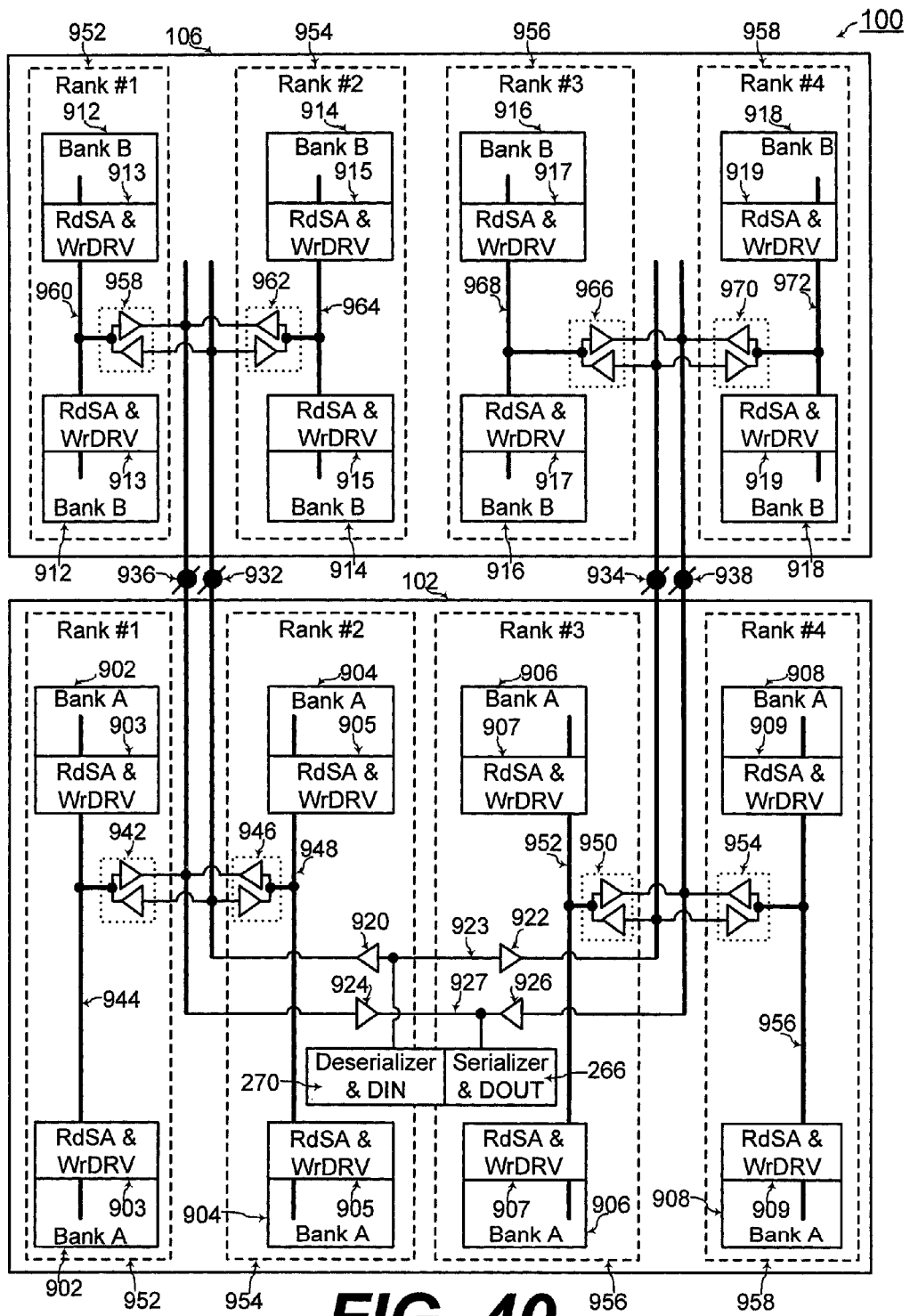

In another example, FIGS. 32 and 40 illustrate a different capacity organization compared to FIGS. 27 and 29 for the three dimensional memory module 100 having one bank group and multiple ranks. FIG. 27 shows a respective rank being formed entirely within each of the chips 102, 106, 108, and 110. In contrast, FIG. 32 shows each rank being formed with respective bank A, B, C, and D portions vertically through all of the chips 102, 106, 108, and 110. Also in FIG. 27, each of the chips has respective bank A, B, C, and D portions. In contrast in FIG. 32, each of the memory banks A, B, C, and D are formed entirely in a respective one of the chips 102, 106, 108, and 110.

Thus in FIG. 40, the master chip 102 includes first memory bank A portions 902 with corresponding read sense amplifier and write driver units 903 forming part of the first rank 952 (shown outlined in dashed lines in FIG. 40). The master chip 102 also includes second memory bank A portions 904 with corresponding read sense amplifier and write driver units 905 forming part of the second rank 954 (shown outlined in dashed lines in FIG. 40).

The master chip 102 further includes third memory bank A portions 906 with corresponding read sense amplifier and write driver units 907 forming part of the third rank 956 (shown outlined in dashed lines in FIG. 40). The master chip 102 also includes fourth memory bank A portions 908 with corresponding read sense amplifier and write driver units 909 forming part of the fourth rank 958 (shown outlined in dashed lines in FIG. 40).

Further in FIG. 40, the slave chip 106 includes first memory bank B portions 912 with corresponding read sense amplifier and write driver units 913 forming part of the first rank 952. The slave chip 106 also includes second memory bank B portions 914 with corresponding read sense amplifier and write driver units 915 forming part of the second rank 954. The slave chip 106 further includes third memory bank B portions 916 with corresponding read sense amplifier and write driver units 917 forming part of the third rank 956. The slave chip 106 also includes fourth memory bank B portions 918 with corresponding read sense amplifier and write driver units 919 forming part of the fourth rank 958.

Also referring to FIG. 40, the master chip 102 includes the serializer 266, the deserializer 270, first gating units 920 and 922 coupled to the deserializer 270 at a first node 923, and second gating units 924 and 926 coupled to the serializer 266 at a second node 927. The first gating units 920 and 922 determine which one of first and second write TSVs 932 and 934 has write data from the deserializer 270 applied thereon. The second gating units 924 and 926 determine which one of first and second read TSVs 936 and 938 is connected to the serializer 266 that serializes respective read data on such a selected one of the read TSVs.

Further referring to FIG. 40, a third gating unit 942 controls coupling of one of the read TSVs 936 and the write TSVs 932 to a first bank interconnect 944 connected to the bank A portions 902. A fourth gating unit 946 controls coupling of one of the read TSVs 936 and the write TSVs 932 to a second bank interconnect 948 connected to the bank A portions 904. A fifth gating unit 950 controls coupling of one of the read TSVs 938 and the write TSVs 934 to a third bank interconnect 952 connected to the bank A portions 906. A sixth gating unit 954 controls coupling of one of the read TSVs 938 and the write TSVs 934 to a fourth bank interconnect 956 connected to the bank A portions 908.

Also referring to FIG. 40, a seventh gating unit 958 controls coupling of one of the read TSVs 936 and the write TSVs 932 to a fifth bank interconnect 960 connected to the bank B portions 952. An eighth gating unit 962 controls coupling of one of the read TSVs 936 and the write TSVs 932 to a sixth bank interconnect 964 connected to the bank B portions 914. A ninth gating unit 966 controls coupling of one of the read TSVs 938 and the write TSVs 934 to a seventh bank interconnect 968 connected to the bank B portions 916. A tenth gating unit 970 controls coupling of one of the read TSVs 938 and the write TSVs 934 to an eighth bank interconnect 972 connected to the bank B portions 918.

Comparing FIGS. 29 and 40, the number of TSVs 936, 932, 934, and 938 in FIG. 40 is similar to the number of TSVs 592, 596, 598, and 594 of FIG. 29. In addition, the number of gating units 920, 922, 924, 926, 942, 946, 952, 954, 958, 962, 966, and 970 in FIG. 40 is similar to the number of gating units 584, 586, 580, 582, 602, 606, 610, 614, 618, 622, 626, and 630 in FIG. 29. Thus, the capacity organization of FIGS. 32 and 40 has similar efficiency to the capacity organization of FIGS. 27 and 29 for forming multiple ranks in the three dimensional memory module 100.

The foregoing is by way of example only and is not intended to be limiting. For example, any number of elements as illustrated and described herein is by way of example only. The present invention is limited only as defined in the following claims and equivalents thereof.

The invention claimed is:

1. A three dimensional memory system comprising:
a first type chip;
a plurality of second type chips stacked with the first type chip;
through electrodes formed through at least one of the second type chips;
a first signal path disposed on the first type chip; and
a respective second signal path disposed on each second type chip, wherein the first signal path is coupled to the respective second signal paths via the through electrodes,
and wherein the first signal path is along at least one first interconnect structure fabricated on a first semiconductor substrate between a circuit of the first type chip and a through electrode, and wherein the second signal path is along at least one second interconnect structure fabricated on a second semiconductor substrate of the second type chip between said through electrode and a memory bank of the second type chip,
and wherein a first length of the first interconnect structure is greater than the second length of the second interconnect structure.

2. The three dimensional memory system of claim 1, wherein the first type chip is a master chip, and wherein the plurality of the second type chips are a plurality of slave chips stacked with the master chip.

3. The three dimensional memory system of claim 2, wherein the first signal path is for transmitting a first signal from an external source through the master chip, and wherein the second signal path is for transmitting a second signal from one of the through electrodes to the slave chip.

4. The three dimensional memory system of claim 1, wherein the first length of the first interconnect structure is at least two times greater than the second length of the second interconnect structure.

5. The three dimensional memory system of claim 1, wherein said circuit fabricated on the first type chip is for processing signals within the first type chip.

6. The three dimensional memory system of claim 1, wherein said circuit fabricated on the first type chip includes one of a control logic, an address register, a data serializier, or a data deserializer.

7. The three dimensional memory system of claim 1, wherein the first type chip is a master chip having a master memory core.

8. The three dimensional memory system of claim 7, wherein the second type chips are a plurality of slave chips stacked with the master chip, and wherein each of the slave chips has a respective slave memory core.

9. The three dimensional memory system of claim 1, wherein the second type chips are a plurality of slave chips stacked with the first type chip, and wherein each of the slave chips has a respective slave memory core.

* * * * *